US012784695B2

(12) United States Patent
Kim

(10) Patent No.: US 12,784,695 B2
(45) Date of Patent: Nov. 3, 2026

(54) GATE DRIVING CIRCUIT, DISPLAY DEVICE INCLUDING THE SAME, AND ELECTRONIC DEVICE INCLUDING THE SAME

(71) Applicant: Samsung Display Co., LTD., Yongin-si (KR)

(72) Inventor: Eok Su Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/316,503

(22) Filed: Sep. 2, 2025

(65) Prior Publication Data

US 2026/0301678 A1 Oct. 1, 2026

(30) Foreign Application Priority Data

Mar. 27, 2025 (KR) ........................ 10-2025-0039219

(51) Int. Cl.
*G09G 3/3266* (2016.01)
*H10K 59/121* (2023.01)
*G09G 3/3233* (2016.01)

(52) U.S. Cl.
CPC ....... *G09G 3/3266* (2013.01); *H10K 59/1213* (2023.02); *H10K 59/1216* (2023.02); *G09G 3/3233* (2013.01); *G09G 2300/0408* (2013.01); *G09G 2300/0426* (2013.01); *G09G 2300/0819* (2013.01); *G09G 2300/0852* (2013.01); *G09G 2310/0281* (2013.01); *G09G 2310/0286* (2013.01)

(58) Field of Classification Search
CPC ............... G09G 3/3266; G09G 3/3233; G09G 2300/0408; G09G 2300/0426; G09G 2300/0819; G09G 2300/0852; G09G 2310/0281; G09G 2310/0286; H10K 59/1213; H10K 59/1216
See application file for complete search history.

(56) References Cited

U.S. PATENT DOCUMENTS

| | | | | |
|---|---|---|---|---|
| 9,035,298 | B2 * | 5/2015 | Nakazawa | H10D 30/6755 257/43 |
| 9,202,827 | B2 | 12/2015 | Koyama et al. | |
| 12,069,918 | B2 * | 8/2024 | Jeon | H10D 86/481 |
| 2021/0056908 | A1 * | 2/2021 | Park | G09G 3/3266 |

FOREIGN PATENT DOCUMENTS

| | | | |
|---|---|---|---|
| CN | 117711298 | A | 3/2024 |
| KR | 1020190115546 | A | 10/2019 |
| KR | 1020220081435 | A | 6/2022 |

* cited by examiner

*Primary Examiner* — Antonio Xavier
(74) *Attorney, Agent, or Firm* — CANTOR COLBURN LLP

(57) ABSTRACT

A gate driving circuit includes a buffer transistor, which outputs a gate clock signal as a gate output signal in response to a signal of a pull-up control node and a boost capacitor, which boosts a voltage level of the signal of the pull-up control node. The buffer transistor includes a semiconductor pattern, a gate electrode connected to the pull-up control node, an input electrode to which the gate clock signal is applied, and an output electrode connected to a gate output terminal. The boost capacitor includes a first electrode connected to the gate electrode of the buffer transistor and a second electrode connected to the output electrode of the buffer transistor. The boost capacitor entirely overlaps the buffer transistor in a plan view.

20 Claims, 19 Drawing Sheets

GATE DRIVING CIRCUIT, DISPLAY DEVICE INCLUDING THE SAME, AND ELECTRONIC DEVICE INCLUDING THE SAME

This application claims priority to Korean Patent Application No. 10-2025-0039219, filed on Mar. 27, 2025, and all the benefits accruing therefrom under 35 U.S.C. § 119, the content of which in its entirety is herein incorporated by reference.

BACKGROUND

1. Field

Embodiments relate to a display device. More particularly, embodiments relate to a gate driving circuit with improved a degree of integration, a display device including the same, and an electronic device including the same.

2. Description of the Related Art

In general, a display device includes a display panel and a display panel driver. The display panel displays an image based on an input image data, and includes a plurality of gate lines, a plurality of data lines, and a plurality of pixels. The display panel driver includes a gate driver that provides a gate signal to the plurality of gate lines and a data driver that provides a data voltage to the data lines.

The gate driver includes gate driving circuits that generate the gate signal. Each of the gate driving circuits includes a plurality of transistors for generating the gate signal. The gate driving circuits may be integrated in a peripheral area of the display panel. In order to reduce a dead space of the display device, it is desirable to improve a degree of integration of the gate driving circuits.

SUMMARY

Embodiments provide a gate driving circuit with improved a degree of integration.

Embodiments also provide a display device with reduced a dead space.

Embodiments also provide an electronic device with reduced a dead space.

Additional features of the inventions will be set forth in the description which follows, and in part will be apparent from the description, or may be learned by practice of the inventions.

A gate driving circuit according to an embodiment includes a buffer transistor configured to output a gate clock signal as a gate output signal in response to a signal of a pull-up control node and a boost capacitor configured to boost a voltage level of the signal of the pull-up control node. The buffer transistor includes a semiconductor pattern, a gate electrode connected to the pull-up control node, an input electrode to which the gate clock signal is applied, and an output electrode connected to a gate output terminal. The boost capacitor includes a first electrode connected to the gate electrode of the buffer transistor and a second electrode connected to the output electrode of the buffer transistor. The boost capacitor entirely overlaps the buffer transistor in a plan view.

In an embodiment, the gate driving circuit may further include a capacitor electrode disposed under the semiconductor pattern and electrically connected to the gate electrode. The semiconductor pattern may include a first contact area, a second contact area spaced apart from the first contact area, and a channel area between the first contact area and the second contact area. The gate electrode may be disposed on the semiconductor pattern and overlaps the channel area of the semiconductor pattern in the plan view. The input electrode may be disposed on the gate electrode and contacts the first contact area of the semiconductor pattern. The output electrode may be disposed on the gate electrode and contacts the second contact area of the semiconductor pattern. The capacitor electrode may include a first portion overlapping the second contact area of the semiconductor pattern in the plan view. The first portion of the capacitor electrode and the second contact area of the semiconductor pattern may constitute the boost capacitor.

In an embodiment, the boost capacitor may include a first sub-capacitor and a second sub-capacitor. The first portion of the capacitor electrode and the second contact area of the semiconductor pattern may constitute the first sub-capacitor.

In an embodiment, the first sub-capacitor may entirely overlap the semiconductor pattern in the plan view.

In an embodiment, the capacitor electrode may further include a second portion adjacent to the first portion and overlapping the output electrode in the plan view. The second portion of the capacitor electrode and the output electrode may constitute the second sub-capacitor.

In an embodiment, the second sub-capacitor may entirely overlap the output electrode.

In an embodiment, the first electrode of the boost capacitor may include a first-first electrode and a second-first electrode. The second electrode of the boost capacitor may include a first-second electrode and a second-second electrode. The capacitor electrode may include the first-first electrode and the second-first electrode. The second contact area of the semiconductor pattern may include the first-second electrode. The output electrode may include the second-second electrode.

In an embodiment, the buffer transistor may include a plurality of semiconductor patterns arranged in a first direction and each extending in a second direction crossing the first direction. The output electrode may include a plurality of branch output electrodes each extending in the first direction. The first sub-capacitor may be provided in plurality, and the second sub-capacitor may be provided in plurality. The plurality of the first sub-capacitors and the plurality of the second sub-capacitors may overlap the plurality of branch output electrodes in the plan view.

In an embodiment, some of the first sub-capacitors and some of the second sub-capacitors, which overlap one of the plurality of branch output electrodes in the plan view, may be alternately disposed in the first direction.

In an embodiment, the capacitor electrode may further include a third portion adjacent to the first portion and overlapping the channel area of the semiconductor pattern in the plan view. The buffer transistor may have a dual gate structure. The gate electrode may be a top gate electrode of the buffer transistor, and the third portion of the capacitor electrode may be a bottom gate electrode of the buffer transistor.

In an embodiment, in the plan view, a size of the second sub-capacitor may be less than a size of the first sub-capacitor.

In an embodiment, the gate driving circuit may further include a connection electrode connecting the capacitor electrode and the gate electrode.

In an embodiment, in the plan view, a size of the boost capacitor may be less than a size of the buffer transistor.

In an embodiment, the semiconductor pattern may include an oxide semiconductor material.

A display device according to an embodiment includes a substrate including a display area and a peripheral area around the display area, a pixel transistor disposed in the display area on the substrate, a light emitting element disposed in the display area on the substrate and connected to the pixel transistor, and a gate driving circuit disposed in the peripheral area on the substrate. The gate driving circuit includes a buffer transistor configured to output a gate clock signal as a gate output signal in response to a signal of a pull-up control node and a boost capacitor configured to boost a voltage level of the signal of the pull-up control node. The buffer transistor includes a semiconductor pattern, a gate electrode connected to the pull-up control node, an input electrode to which the gate clock signal is applied, and an output electrode connected to a gate output terminal. The boost capacitor includes a first electrode connected to the gate electrode of the buffer transistor and a second electrode connected to the output electrode of the buffer transistor. The boost capacitor entirely overlaps the buffer transistor in a plan view.

In an embodiment, the semiconductor pattern may include a first contact area, a second contact area spaced apart from the first contact area, and a channel area between the first contact area and the second contact area. The gate electrode may be disposed on the semiconductor pattern and overlaps the channel area of the semiconductor pattern in the plan view. The input electrode may be disposed on the gate electrode and contacts the first contact area of the semiconductor pattern. The output electrode may be disposed on the gate electrode and contacts the second contact area of the semiconductor pattern. The gate driving circuit may include a capacitor electrode disposed under the semiconductor pattern, electrically connected to the gate electrode, and including a first portion overlapping the second contact area of the semiconductor pattern in the plan view. The first portion of the capacitor electrode and the second contact area of the semiconductor pattern may constitute the boost capacitor.

In an embodiment, the pixel transistor may include a pixel semiconductor pattern, a pixel gate electrode, a pixel input electrode, a pixel output electrode, and a bottom conductive layer disposed under the pixel semiconductor pattern and connected to the pixel output electrode. The capacitor electrode and the bottom conductive layer may be in a same layer.

In an embodiment, the boost capacitor may include a first sub-capacitor and a second sub-capacitor. The first portion of the capacitor electrode and the second contact area of the semiconductor pattern may constitute the first sub-capacitor.

In an embodiment, the capacitor electrode may further include a second portion adjacent to the first portion and overlapping the output electrode in the plan view. The second portion of the capacitor electrode and the output electrode may constitute the second sub-capacitor.

An electronic device according to an embodiment includes a display device and a processor configured to provide input image data and an input control signal to the display device. The display device includes a display panel including a plurality of gate lines and a gate driver including a plurality of gate driving circuits configured to output gate signals to the plurality of gate lines. Each of the plurality of gate driving circuits includes a buffer transistor configured to output a gate clock signal as a gate output signal in response to a signal of a pull-up control node and a boost capacitor configured to boost a voltage level of the signal of the pull-up control node. The buffer transistor includes a semiconductor pattern, a gate electrode connected to the pull-up control node, an input electrode to which the gate clock signal is applied, and an output electrode connected to a gate output terminal. The boost capacitor includes a first electrode connected to the gate electrode of the buffer transistor and a second electrode connected to the output electrode of the buffer transistor. The boost capacitor entirely overlaps the buffer transistor in a plan view.

According to embodiments, the gate driving circuit may include the buffer transistor and the boost capacitor. The boost capacitor may be disposed to entirely overlap the buffer transistor in a plan view. Therefore, a degree of integration of the gate driving circuit may be improved, and a dead space of the display device may be effectively reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
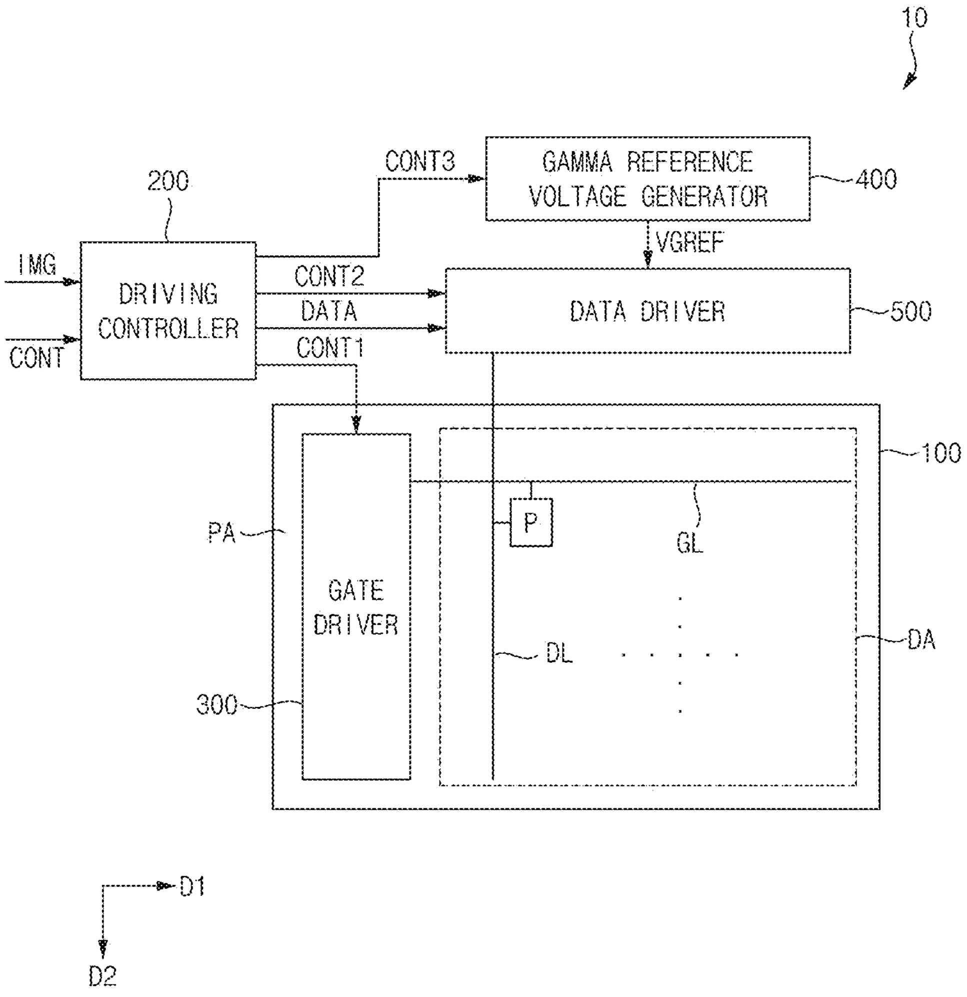
FIG. 1 is a block diagram illustrating a display device according to an embodiment.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

In the disclosure, various modifications can be made, various forms can be used, and specific embodiments will be illustrated in the drawings and described in detail in the text. However, this is not intended to limit the disclosure to a specific form disclosed, and it will be understood that all changes, equivalents, or substitutes which fall in the spirit and technical scope of the disclosure should be included.

It will be understood that, although the terms “first”, “second”, “third”, “first-first”, “second-first”, etc. may be used herein to describe various elements, these elements should not be limited by these terms. These terms are used to distinguish one element from another. Thus, a first element discussed below could be termed a second element without departing from the teachings of the present invention. As used herein, the term “and/or” includes any and all combinations of one or more of the associated listed items.

It will be understood that when an element is referred to as being “connected” or “coupled” to another element, it can be directly connected or coupled to the other element or intervening element(s) may be present. In contrast, when an element is referred to as being “directly connected” or “directly coupled” to another element, there are no intervening elements present. Other words used to describe the relationship between elements should be interpreted in a like fashion (e.g., “between” versus “directly between,” “adjacent” versus “directly adjacent,” etc.).

The terminology used herein is for the purpose of describing particular example embodiments only and is not intended to be limiting of the present invention. As used herein, the singular forms “a,” “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as “lower” or “bottom” and “upper” or “top,” may be used herein to describe one element’s relationship to another element as illustrated in the Figures. It will be understood that relative terms are intended to encompass different orientations of the device in addition to the orientation depicted in the Figures. For example, if the device in one of the figures is turned over, elements described as being on the “lower” side of other elements would then be oriented on “upper” sides of the other elements. The term “lower,” can therefore, encompasses both an orientation of “lower” and “upper,” depending on the particular orientation of the figure. Similarly, if the device in one of the figures is turned over, elements described as “below” or “beneath” other elements would then be oriented “above” the other elements. The terms “below” or “beneath” can, therefore, encompass both an orientation of above and below. It will be understood that when an element is referred to as being “on” another element, it can be directly on the other element or intervening elements may be present therebetween. In contrast, when an element is referred to as being “directly on” another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings. The same reference numerals are used for the same components in the drawings, and redundant descriptions of the same components will be omitted.

FIG. 1 is a block diagram illustrating a display device according to an embodiment.

Referring to FIG. 1, a display device 10 may include a display panel 100 and a panel driver. The panel driver may include a driving controller 200, a gate driver 300, a gamma reference voltage generator 400, and a data driver 500.

In an embodiment, the driving controller 200 and the data driver 500 may be integrated. In an embodiment, the driving controller 200, the gamma reference voltage generator 400, and the data driver 500 may be integrated. For example, a driving module which is provided by (e.g., formed by) an integration of at least the driving controller 200 and the data driver 500 may be referred to as a timing controller embedded data driver (TED).

The display panel 100 may include a display area DA for displaying an image and a peripheral area PA positioned around the display area DA.

The display panel 100 may include a plurality of gate lines GL, a plurality of data lines DL, and a plurality of pixels P electrically connected to the plurality of gate lines GL and the plurality of data lines DL. In an embodiment, each of the gate lines GL may extend generally in a first direction D1, and each of the data lines DL may extend generally in a second direction D2 crossing the first direction D1. For example, the second direction D2 may be perpendicular to the first direction D1.

The pixels P may be disposed in the display area DA. Each of the pixels P may include a pixel circuit and a light emitting element. The pixel circuit may include at least one thin film transistor and at least one capacitor. The pixel circuit may generate a driving current and provide the generated driving current to the light emitting element. The light emitting element may emit light based on the driving current. For example, the light emitting element may include an organic light emitting diode, an inorganic light emitting diode, a quantum dot light emitting diode, a micro light emitting diode, or the like. The light emitted from the pixels P may be combined to generate the image.

The peripheral area PA may be positioned outside the display area DA. For example, the peripheral area PA may surround at least a portion of the display area DA in a plan view. In an embodiment, the panel driver may be disposed in the peripheral area PA.

Figure 16:
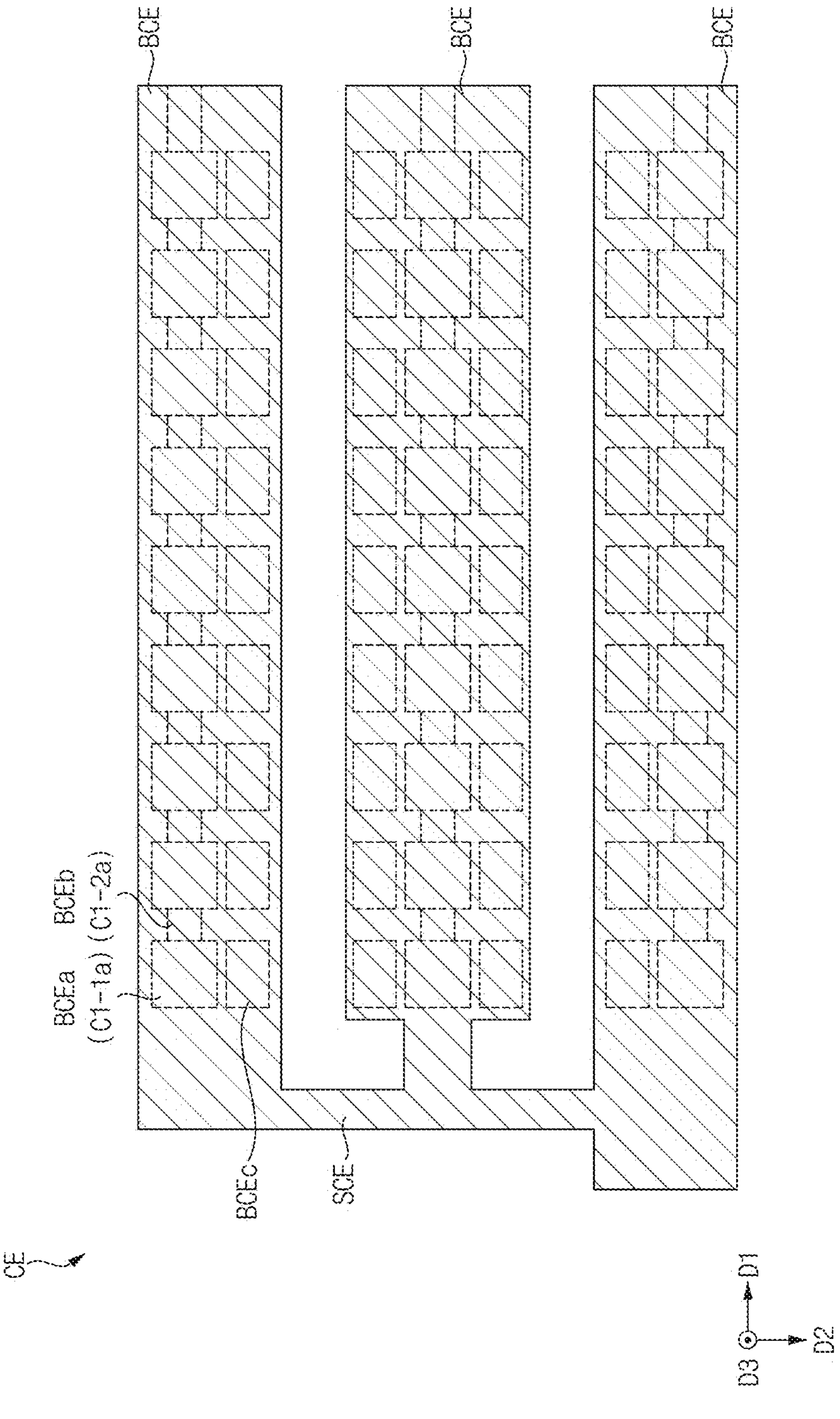
FIG. 16 is a plan view illustrating a capacitor electrode of FIG. 15.

The driving controller 200 may receive input image data IMG and an input control signal CONT from an external device (e.g., a processor 1200 of FIG. 16). For example, the input image data IMG may include red image data, green image data, and blue image data. For example, the input image data IMG may include white image data, magenta image data, yellow image data, cyan image data, or the like. The input control signal CONT may include a master clock signal and a data enable signal. The input control signal CONT may further include a vertical synchronization signal and a horizontal synchronization signal.

The driving controller 200 may generate a gate control signal CONT1, a data control signal CONT2, a gamma control signal CONT3, and a data signal DATA.

The driving controller 200 may generate the gate control signal CONT1 for controlling the operation of the gate driver 300 based on the input control signal CONT, and may output the gate control signal CONT1 to the gate driver 300. The gate control signal CONT1 may include a vertical start signal and a scan clock signal.

The driving controller 200 may generate the data control signal CONT2 for controlling the operation of the data driver 500 based on the input control signal CONT, and may output the data control signal CONT2 to the data driver 500. The data control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the gamma control signal CONT3 for controlling the operation of the gamma reference voltage generator 400 based on the input control signal CONT, and may output the gamma control signal CONT3 to the gamma reference voltage generator 400.

The gate driver 300 may generate gate signals for driving the gate lines GL in response to the gate control signal CONT1 received from the driving controller 200. The gate driver 300 may output the gate signals to the gate lines GL. For example, the gate driver 300 may sequentially output the gate signals to the gate lines GL. For example, the gate driver 300 may be integrated in the peripheral area PA of the display panel 100.

The gamma reference voltage generator 400 may generate a gamma reference voltage VGREF in response to the gamma control signal CONT3 received from the driving controller 200. The gamma reference voltage generator 400 may provide the gamma reference voltage VGREF to the data driver 500. For example, the gamma reference voltage generator 400 may be formed in the driving controller 200 or in the data driver 500.

The data driver 500 may receive the data control signal CONT2 and the data signal DATA from the driving controller CON and receive the gamma reference voltage VGREF from the gamma reference voltage generator 400. The data driver 500 may convert the data signal DATA into a data voltage in analog form using the gamma reference voltage VGREF. The data driver 500 may output the data voltage to the data line DL.

Figure 2:
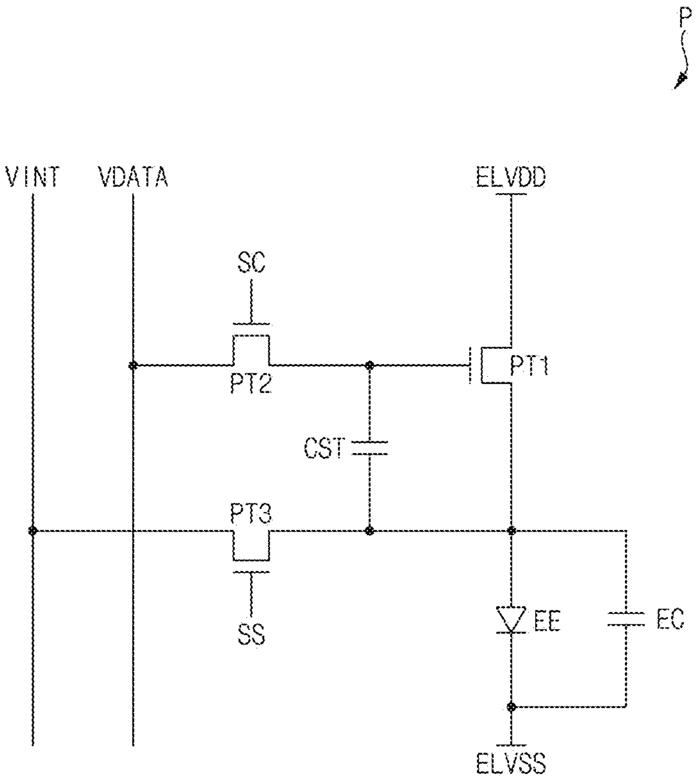
FIG. 2 is an equivalent circuit diagram illustrating an example of a pixel of FIG. 1.

FIG. 2 is an equivalent circuit diagram illustrating an example of a pixel of FIG. 1.

Referring to FIGS. 1 and 2, in an embodiment, the pixel P may include a first pixel transistor PT1, a second pixel transistor PT2, a third pixel transistor PT3, the light emitting element EE, and a storage capacitor CST.

The first pixel transistor PT1 may include a gate electrode connected to the storage capacitor CST, a first electrode to which a high power supply voltage ELVDD is applied, and a second electrode connected to the light emitting element EE.

The second pixel transistor PT2 may include a gate electrode to which a scan gate signal SC is applied, a first electrode to which the data voltage VDATA is applied, and a second electrode connected to the gate electrode of the first pixel transistor PT1.

The third pixel transistor PT3 may include a gate electrode to which a sensing gate signal SS is applied, a first electrode to which an initialization voltage VINT is applied, and a second electrode connected to the light emitting element EE.

In an embodiment, as illustrated in FIG. 2, the first to third pixel transistors PT1, PT2, and PT3 may be NMOS transistors. In this case, the first electrode of each of the first to third pixel transistors PT1, PT2, and PT3 may be a drain electrode, and the second electrode of each of the first to third pixel transistors PT1, PT2, and PT3 may be a source electrode. However, the present invention is not limited thereto.

The light emitting element EE may include a first electrode (e.g., an anode electrode) connected to the second electrode of the first pixel transistor PT1 and a second electrode (e.g., a cathode electrode) to which a low power supply voltage ELVSS is applied.

The storage capacitor CST may include a first electrode connected to the gate electrode of the first pixel transistor PT1 and a second electrode connected to the second electrode of the first pixel transistor PT1.

In an embodiment, the pixel P may further include a light emitting element capacitor EC connected to the first electrode of the light emitting element EE and the second electrode of the light emitting element EE. The light emitting element capacitor EC may mean an internal capacitance of the light emitting element EE.

When the scan gate signal SC is activated, the second pixel transistor PT2 may be turned on, so that the data voltage VDATA may be applied to the gate electrode of the first pixel transistor PT1.

When the sensing gate signal SS is activated, the third pixel transistor PT3 may be turned on, so that the initialization voltage VINT may be applied to the second electrode of the first pixel transistor PT1.

Because the data voltage VDATA and the initialization voltage VINT are applied to the gate electrode and the second electrode of the first pixel transistor PT1, respectively, and the initialization voltage VINT has a constant level, a brightness of the light emitting element EE may be controlled by a level of the data voltage VDATA.

Figure 3:
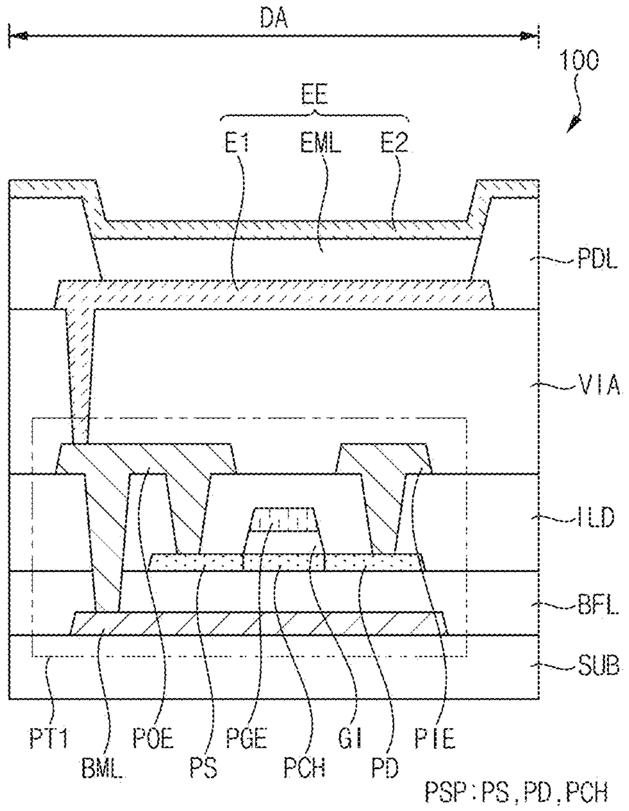
FIG. 3 is a cross-sectional view of a display panel of FIG. 1.

FIG. 3 is a cross-sectional view of a display panel of FIG. 1.

FIG. 3 is a cross-sectional view of the display area DA of the display panel 100 of FIG. 1, and illustrates some of the components included in the display panel 100 for convenience of descriptions.

Referring to FIG. 3, in an embodiment, the display panel 100 may include a substrate SUB, the first pixel transistor PT1, a buffer layer BFL, a gate insulating layer GI, an interlayer-insulating layer ILD, a via-insulating layer VIA, a pixel defining layer PDL, and the light emitting element EE.

The substrate SUB may form a base of the display panel 100. In an embodiment, examples of materials that can be used as the substrate SUB may include glass, quartz, silicon, polymers, or the like. These may be used alone or in combination with each other. In addition, the substrate SUB may have a single layer structure or a multi-layer structure in which a plurality of layers including different materials are stacked.

The first pixel transistor PT1 may be disposed on the substrate SUB. In an embodiment, the first pixel transistor PT1 may include a bottom conductive layer BML, a pixel semiconductor pattern PSP, a pixel gate electrode PGE, a pixel input electrode PIE, and a pixel output electrode POE. For example, the pixel input electrode PIE may be the first electrode (e.g., the drain electrode) of the first pixel transistor PT1, and the pixel output electrode POE may be the second electrode (e.g., the source electrode) of the first pixel transistor PT1.

The bottom conductive layer BML may be disposed on the substrate SUB. In an embodiment, the bottom conductive layer BML may overlap the pixel semiconductor pattern PSP in a plan view. For example, the bottom conductive layer BML may be disposed under the pixel semiconductor pattern PSP to function as a light blocking pattern, and the operation characteristics of the first pixel transistor PT1 may be stabilized. For example, the bottom conductive layer BML may be connected to the pixel output electrode POE to shift a threshold voltage of the first pixel transistor PT1 in a negative or positive direction. However, the present invention is not limited thereto.

The bottom conductive layer BML may include a conductive material, such as a metal, an alloy, or the like. The bottom conductive layer BML may have a single layer structure or a multi-layer structure including a plurality of conductive layers.

The buffer layer BFL may be disposed on the substrate SUB. The buffer layer BFL may cover the bottom conductive layer BML on the substrate SUB. In an embodiment, the buffer layer BFL may include an inorganic insulating material, such as a silicon compound, a metal oxide, or the like. The buffer layer BFL may have a single layer structure or a multi-layer structure including a plurality of insulating layers.

The pixel semiconductor pattern PSP may be disposed on the buffer layer BFL. The pixel semiconductor pattern PSP may include a first pixel contact area PD (e.g., a drain area), a second pixel contact area PS (e.g., a source area), and a pixel channel area PCH between the first pixel contact area PD and the second pixel contact area PS. Each of the first pixel contact area PD and the second pixel contact area PS may have higher conductivity than the pixel channel area PCH.

In an embodiment, the pixel semiconductor pattern PSP may include an oxide semiconductor material. For example, the pixel semiconductor pattern PSP may include indium gallium zinc oxide (IGZO), zinc tin oxide (ZTO), indium tin zinc oxide (ITZO), or the like. These may be used alone or in combination with each other. However, the present invention is not limited thereto, and the pixel semiconductor pattern PSP may include a silicon semiconductor material, an organic semiconductor material, or the like.

The gate insulating layer GI may be disposed on the pixel semiconductor pattern PSP. In an embodiment, as illustrated in FIG. 3, the gate insulating layer GI may be disposed only on the pixel channel area PCH of the pixel semiconductor pattern PSP (e.g., only under the pixel gate electrode PGE). In another embodiment, the gate insulating layer GI may be entirely disposed on the buffer layer BFL, and may cover the pixel semiconductor pattern PSP.

In an embodiment, the gate insulating layer GI may include an inorganic insulating material, such as a silicon compound, a metal oxide, or the like. The gate insulating layer GI may have a single layer structure or a multi-layer structure including a plurality of insulating layers.

The pixel gate electrode PGE may be disposed on the gate insulating layer GI. The pixel gate electrode PGE may overlap the pixel channel area PCH of the pixel semiconductor pattern PSP. The pixel gate electrode PGE may include a conductive material, such as a metal, an alloy, a conductive metal oxide, a conductive metal nitride, a transparent conductive oxide, or the like. The pixel gate electrode PGE may have a single layer structure or a multi-layer structure including a plurality of conductive layers.

The interlayer-insulating layer ILD may be disposed on the buffer layer BFL. The interlayer-insulating layer ILD may cover the pixel semiconductor pattern PSP, the gate insulating layer GI, and the pixel gate electrode PGE on the buffer layer BFL. In an embodiment, the interlayer-insulating layer ILD may include an inorganic insulating material, such as a silicon compound, a metal oxide, or the like. The interlayer-insulating layer ILD may have a single layer structure or a multi-layer structure including a plurality of insulating layers.

The pixel input electrode PIE and the pixel output electrode POE may be disposed on the interlayer-insulating layer ILD. In an embodiment, the pixel input electrode PIE may contact the first pixel contact area PD of the pixel semiconductor pattern PSP through a contact hole, and the pixel output electrode POE may contact the second pixel contact area PS of the pixel semiconductor pattern PSP through a contact hole. In an embodiment, the pixel output electrode POE may further contact the bottom conductive layer BML through a contact hole.

Each of the pixel input electrode PIE and the pixel output electrode POE may include a conductive material, such as a metal, an alloy, a conductive metal oxide, a conductive metal nitride, a transparent conductive oxide, or the like. Each of the pixel input electrode PIE and the pixel output electrode POE may have a single layer structure or a multi-layer structure including a plurality of conductive layers.

The via insulation layer VIA may be disposed on the interlayer insulation layer ILD. The via insulation layer VIA may cover the pixel input electrode PIE and the pixel output electrode POE on the interlayer insulation layer ILD. In an embodiment, the via insulation layer VIA may include an organic insulating material. The via insulation layer VIA may have a single layer structure or a multi-layer structure including a plurality of insulating layers.

The light emitting element EE may be disposed on the via-insulating layer VIA. In an embodiment, the light emitting element EE may include a first electrode E1, an emission layer EML, and a second electrode E2.

The first electrode E1 may be disposed on the via-insulating layer VIA. In an embodiment, the first electrode E1 may contact the pixel output electrode POE of the first pixel transistor PT1. The first electrode E1 may include a conductive material, such as a metal, an alloy, a conductive metal oxide, a conductive metal nitride, a transparent conductive oxide, or the like. The first electrode E1 may have a single-layer structure or a multi-layer structure including a plurality of conductive layers. For example, the first electrode E1 may be the anode electrode of the light emitting element EE.

The pixel defining layer PDL may be disposed on the via-insulating layer VIA. The pixel defining layer PDL may cover a peripheral portion of the first electrode E1, and may define a pixel opening that exposes a central portion of the first electrode E1. An emission area may be defined by the pixel opening.

In an embodiment, the pixel defining layer PDL may include an organic insulating material. For example, the pixel defining layer PDL may include a photosensitive resin. In an embodiment, the pixel defining layer PDL may further include a light blocking material, such as a black dye, a pigment, carbon black, or the like. The pixel defining layer PDL may have a single layer structure or a multi-layer structure including a plurality of insulating layers.

The emission layer EML may be disposed on the first electrode E1 in the pixel opening of the pixel defining layer PDL. In an embodiment, the emission layer EML may also be disposed on an upper surface of the pixel defining layer PDL. For example, the emission layer EML may include an emission material, such as an organic emission material.

The second electrode E2 may be disposed on the emission layer EML. The second electrode E2 may include a conductive material, such as a metal, an alloy, a conductive metal oxide, a conductive metal nitride, a transparent conductive oxide, or the like. The second electrode E2 may have a single-layer structure or a multi-layer structure including a plurality of conductive layers. For example, the second electrode E2 may be the cathode electrode of the light emitting element EE.

In an embodiment, the light emitting element EE may further include a functional layer disposed between the first electrode E1 and the emission layer EML and/or between the emission layer EML and the second electrode E2. For example, the functional layer may include a hole injection layer, a hole transport layer, an electron transport layer, an electron injection layer, or the like.

Although not illustrated in the drawing, various layers, such as an encapsulation layer, a touch sensing layer, a polarizing layer, or the like may be additionally disposed on the light emitting element EE.

Figure 4:
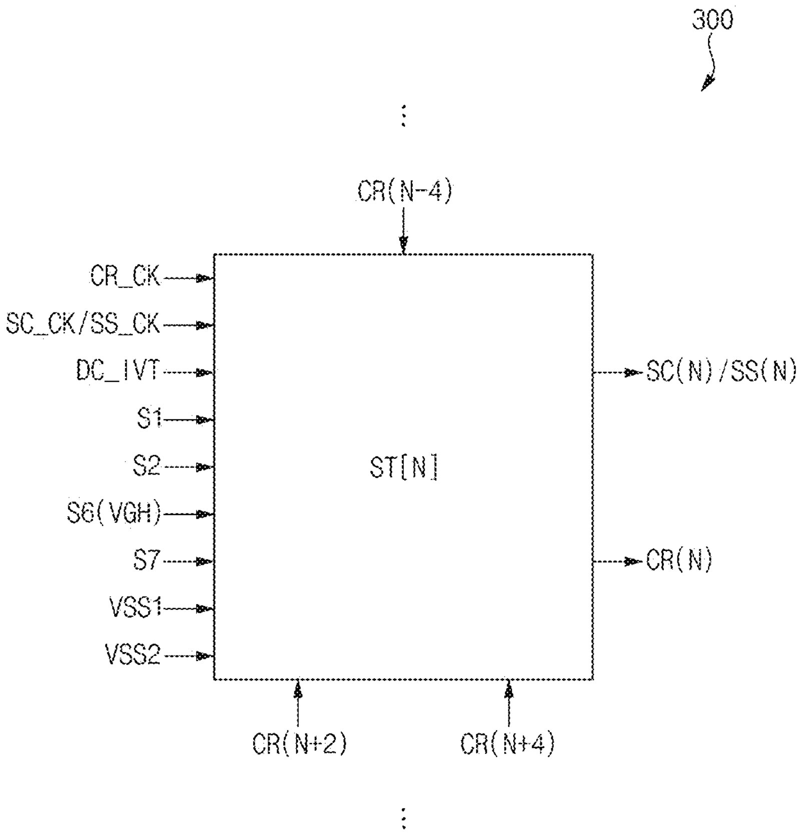
FIG. 4 is a block diagram illustrating a gate driver of FIG. 1.
Figure 5:
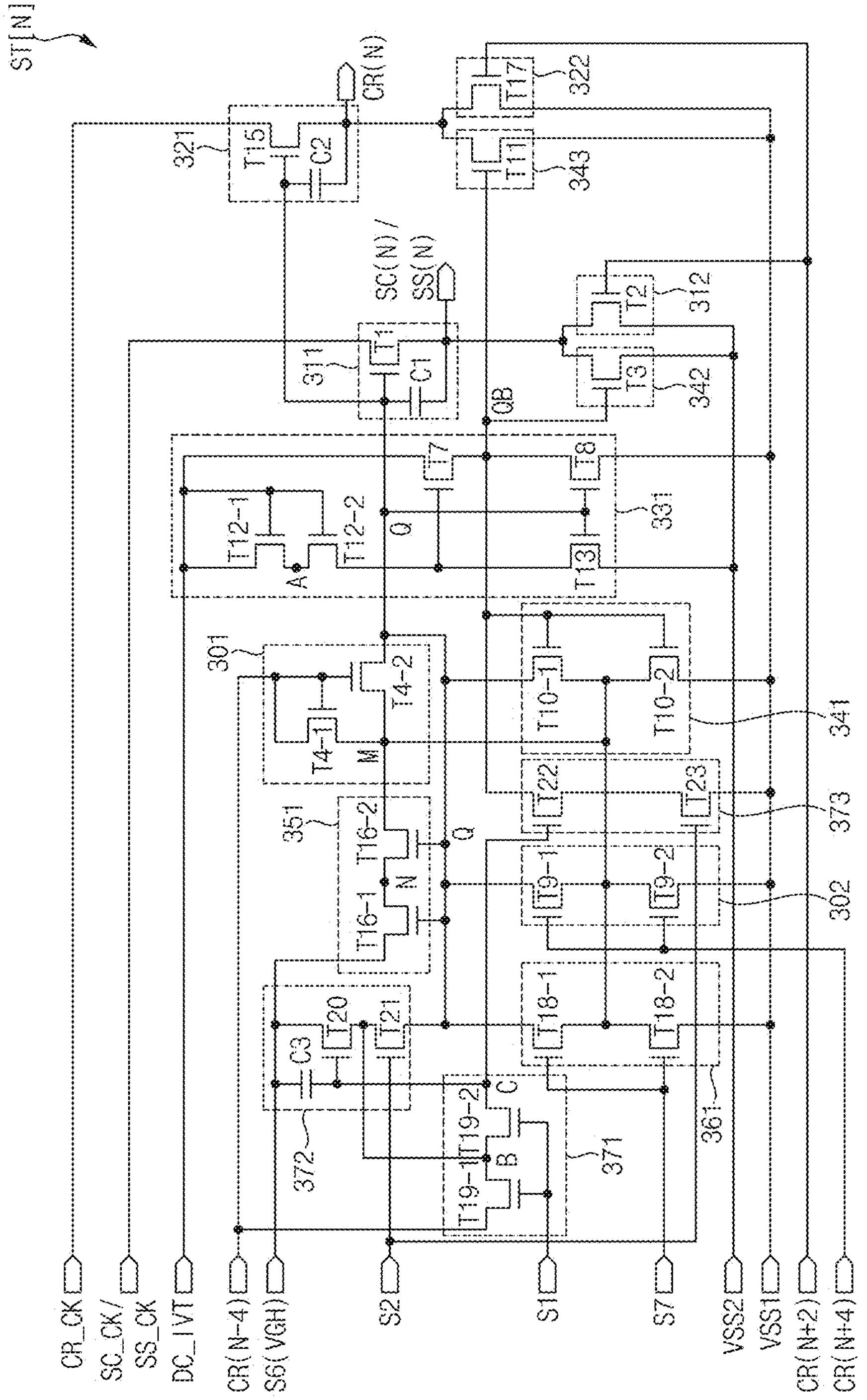
FIG. 5 is an equivalent circuit diagram illustrating an example of a stage of FIG. 4.
Figure 6:
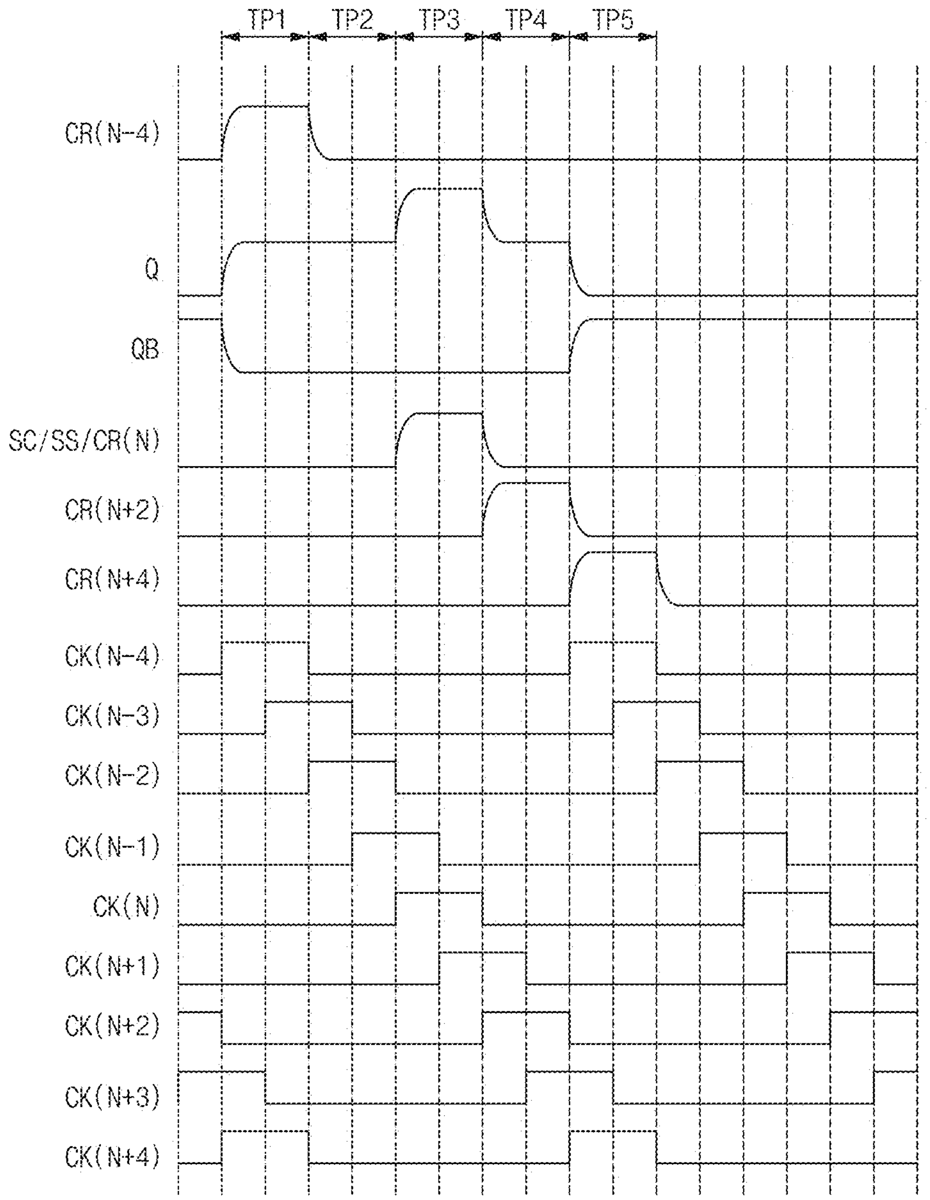
FIG. 6 is a timing diagram illustrating input signals, node signals, and output signals of the stage of FIG. 5.

FIG. 4 is a block diagram illustrating a gate driver of FIG. 1. FIG. 5 is an equivalent circuit diagram illustrating an example of a stage of FIG. 4. FIG. 6 is a timing diagram illustrating input signals, node signals, and output signals of the stage of FIG. 5.

Referring to FIGS. 4 to 6, the gate driver 300 may include a plurality of gate driving circuits (or a plurality of stages). For example, a first gate driving circuit of the gate driver 300 may output a gate signal corresponding to a first gate line, a second gate driving circuit of the gate driver 300 may output a gate signal corresponding to a second gate line, and an (N)th (N is a natural number) gate driving circuit ST(N) of the gate driver 300 may output a gate signal corresponding to an N-th gate line. The N-th gate driving circuit ST(N) may be a gate driving circuit of a current stage (the N-th stage). Hereinafter, for convenience of description, the N-th gate driving circuit ST(N) is referred to as a gate driving circuit ST(N).

In an embodiment, the gate driving circuit ST(N) may include a first pull-up control circuit 301, a pull-up circuit 311, a pull-down circuit 312, and an inverting circuit 331.

The first pull-up control circuit 301 may apply a previous carry signal CR(N−4) to a pull-up control node Q in response to the previous carry signal CR(N−4), which is one signal among the carry signals output from the gate driving circuits of the previous stage. For example, the previous carry signal CR(N−4) may be a carry signal output from the N−4th gate driving circuit.

In an embodiment, the first pull-up control circuit 301 may include a fourth-first transistor T4-1 and a fourth-second transistor T4-2. The fourth-first transistor T4-1 may include a gate electrode to which the previous carry signal CR(N−4) is applied, a first electrode to which the previous carry signal CR(N−4) is applied, and a second electrode connected to a first intermediate node M. The fourth-second transistor T4-2 may include a gate electrode to which the previous carry signal CR(N−4) is applied, a first electrode connected to the first intermediate node M, and a second electrode connected to the pull-up control node Q.

FIG. 5 illustrates that the first pull-up control circuit 301 includes two transistors T4-1 and T4-2 connected in series to prevent or reduce leakage, but the present invention is not limited thereto, and the first pull-up control circuit 301 may include one transistor or three or more transistors connected in series.

The pull-up circuit 311 may output a gate clock signal SC_CK/SS_CK as a gate output signal SC(N)/SS(N) in response to the signal of the pull-up control node Q. Here, SC(N) may mean a scan gate signal of the gate driving circuit of the current stage (or the N-th stage), and SS(N) may mean a sensing gate signal of the gate driving circuit of the current stage (or the N-th stage).

In an embodiment, the pull-up circuit 311 may include a first transistor T1 and a first capacitor C1. The first transistor T1 may output the gate clock signal SC_CK/SS_CK as the gate output signal SC(N)/SS(N) in response to the signal of the pull-up control node Q. The first transistor T1 may include a gate electrode connected to the pull-up control node Q, a first electrode to which the gate clock signal SC_CK/SS_CK is applied, and a second electrode connected to a gate output terminal. The first capacitor C1 may include a first electrode connected to the pull-up control node Q and the gate electrode of the first transistor T1, and a second electrode connected to the gate output terminal and the second electrode of the first transistor T1. The first capacitor C1 may boost a voltage level of a signal of the pull-up control node Q. The first transistor T1 may be referred to as a pull-up transistor or "buffer transistor", and the first capacitor C1 may be referred to as a "boost capacitor".

In an embodiment, as illustrated in FIG. 5, the first transistor T1 may be an NMOS transistor. In this case, the first electrode of the first transistor T1 may be a drain electrode, and the second electrode of the first transistor T1 may be a source electrode. However, the present invention is not limited thereto. The first electrode (e.g., the drain electrode) of the first transistor T1 may be referred to as an input electrode, and the second electrode (e.g., the source electrode) of the first transistor T) may be referred to as an output electrode.

The pull-down circuit 312 may output a second low voltage VSS2 as the gate output signal SC(N)/SS(N) in response to a first subsequent carry signal CR(N+2), which is one of carry signals of subsequent stages. For example, the first subsequent carry signal CR(N+2) may be a carry signal output from an N+2th gate driving circuit. The second low voltage VSS2 may define a low level of the gate output signal SC(N)/SS(N).

In an embodiment, the pull-down circuit 312 may include a second transistor T2. The second transistor T2 may include a gate electrode to which the first subsequent carry signal CR(N+2) is applied, a first electrode to which the second low voltage VSS2 is applied, and a second electrode connected to the gate output terminal.

The inverting circuit 331 may output one of a direct current (DC) inverter voltage DC_IVT and a first low voltage VSS1 to a pull-down control node QB based on the DC inverter voltage DC_IVT and the signal of the pull-up control node Q. The first low voltage VSS1 may be less than the second low voltage VSS2.

The DC inverter voltage DC_IVT may be less than a high gate voltage VGH which defines a high level of the gate output signal SC(N)/SS(N). The DC inverter voltage DC_IVT may be greater than the first low voltage VSS1 and the second low voltage VSS2.

In an embodiment, the inverting circuit 331 may include a twelfth-first transistor T12-1, a twelfth-second transistor T12-2, a seventh transistor T7, a thirteenth transistor T13, and an eighth transistor T8. The twelfth-first transistor T12-1 may include a gate electrode to which the DC inverter voltage DC_IVT is applied, a first electrode to which the DC inverter voltage DC_IVT is applied, and a second electrode connected to a second intermediate node A. The twelfth-second transistor T12-2 may include a gate electrode to which the DC inverter voltage DC_IVT is applied, a first electrode connected to the second intermediate node A, and a second electrode connected to a gate electrode of the seventh transistor T7. The seventh transistor T7 may include the gate electrode connected to the second electrode of the twelfth-second transistor T12-2, a first electrode to which the DC inverter voltage DC_IVT is applied, and a second electrode connected to the pull-down control node QB. The thirteenth transistor T13 may include a gate electrode connected to the pull-up control node Q, a first electrode connected to the gate electrode of the seventh transistor T7, and a second electrode to which the second low voltage VSS2 is applied. The eighth transistor T8 may include a gate electrode connected to the pull-up control node Q, a first electrode connected to the pull-down control node QB, and a second electrode to which the first low voltage VSS1 is applied.

FIG. 5 illustrates that the inverting circuit 331 includes two transistors T12-1 and T12-2 connected in series to prevent leakage, but the present invention is not limited thereto, and the inverting circuit 331 may include one transistor to replace the twelfth-first transistor T12-1 and the twelfth-second transistor T12-2, or may include three or more transistors connected in series to replace the twelfth-first transistor T12-1 and the twelfth-second transistor T12-2.

The gate driving circuit ST(N) may further include a second pull-up control circuit 302. The second pull-up control circuit 302 may apply the first low voltage VSS1 to the pull-up control node Q in response to a second subsequent carry signal CR(N+4) which is one of the carry signals output from subsequent gate driving circuits. For example, the second subsequent carry signal CR(N+4) may be a carry signal output from an N+4th gate driving circuit.

In an embodiment, the second pull-up control circuit 302 may include a ninth-first transistor T9-1 and a ninth-second transistor T9-2. The ninth-first transistor T9-1 may include a gate electrode to which the second subsequent carry signal CR(N+4) is applied, a first electrode connected to the pull-up control node Q, and a second electrode connected to the first intermediate node M. The ninth-second transistor T9-2 may include a gate electrode to which the second subsequent carry signal CR(N+4) is applied, a first electrode connected to the first intermediate node M, and a second electrode to which the first low voltage VSS1 is applied.

FIG. 5 illustrates that the second pull-up control circuit 302 includes two transistors T9-1 and T9-2 connected in series to prevent or reduce leakage, but the present invention is not limited thereto, and the second pull-up control circuit 302 may include one transistor or three or more transistors connected in series.

The gate driving circuit ST(N) may further include a first hold circuit 341. The first hold circuit 341 may apply the first low voltage VSS1 to the pull-up control node Q in response to the signal of the pull-down control node QB.

In an embodiment, the first hold circuit 341 may include a tenth-first transistor T10-1 and a tenth-second transistor T10-2. The tenth-first transistor T10-1 may include a gate electrode connected to the pull-down control node QB, a first electrode connected to the pull-up control node Q, and a second electrode connected to the first intermediate node M. The tenth-second transistor T10-2 may include a gate electrode connected to the pull-down control node QB, a first electrode connected to the first intermediate node M, and a second electrode to which the first low voltage VSS1 is applied.

FIG. 5 illustrates that the first hold circuit 341 includes two transistors T10-1 and T10-2 connected in series to prevent or reduce leakage, but the present invention is not limited thereto, and the first hold circuit 341 may include one transistor or three or more transistors connected in series.

The gate driving circuit ST(N) may further include a second hold circuit 342. The second hold circuit 342 may output the second low voltage VSS2 as the gate output signal SC(N)/SS(N) in response to the signal of the pull-down control node QB.

For example, the second hold circuit 342 may include a third transistor T3. The third transistor T3 may include a gate electrode connected to the pull-down control node QB, a first electrode to which the second low voltage VSS2 is applied, and a second electrode connected to the gate output terminal.

The gate driving circuit ST(N) may further include a carry pull-up circuit 321 and a carry pull-down circuit 322. The carry pull-up circuit 321 may output a carry clock signal CR_CK as a carry signal CR(N) in response to the signal of the pull-up control node Q. The carry pull-down circuit 322 may output the first low voltage VSS1 as the carry signal CR(N) in response to the first subsequent carry signal CR(N+2).

In an embodiment, the carry pull-up circuit 321 may include a fifteenth transistor T15 and a second capacitor C2. The fifteenth transistor T15 may include a gate electrode connected to the pull-up control node Q, a first electrode to which the carry clock signal CR_CK is applied, and a second electrode connected to a carry output terminal. The second capacitor C2 may include a first electrode connected to the gate electrode of the fifteenth transistor T15 and a second electrode connected to the carry output terminal.

In an embodiment, the carry pull-down circuit 322 may include a seventeenth transistor T17. The seventeenth transistor T17 may include a gate electrode to which the first subsequent carry signal CR(N+2) is applied, a first electrode to which the first low voltage VSS1 is applied, and a second electrode connected to the carry output terminal.

The gate driving circuit ST(N) may further include a third hold circuit 343. The third hold circuit 343 may output the first low voltage VSS1 as the carry signal CR(N) in response to the signal of the pull-down control node QB.

In an embodiment, the third hold circuit 343 may include an eleventh transistor T11. The eleventh transistor T11 may include a gate electrode connected to the pull-down control node QB, a first electrode to which the first low voltage VSS1 is applied, and a second electrode connected to the carry output terminal.

The gate driving circuit ST(N) may further include a reset circuit 361. The reset circuit 361 may apply the first low voltage VSS1 to the pull-up control node Q in response to a reset signal S7.

In an embodiment, the reset circuit 361 may include an eighteenth-first transistor T18-1 and an eighteenth-second transistor T18-2. The eighteenth-first transistor T18-1 may include a gate electrode to which the reset signal S7 is applied, a first electrode connected to the pull-up control node Q, and a second electrode connected to the first intermediate node M. The eighteenth-second transistor T18-2 may include a gate electrode to which the reset signal S7 is applied, a first electrode connected to the first intermediate node M, and a second electrode to which the first low voltage VSS1 is applied.

FIG. 5 illustrates that the reset circuit 361 includes two transistors T18-1 and T18-2 connected in series to prevent or reduce leakage, but the present invention is not limited thereto, and the reset circuit 361 may include one transistor or three or more transistors connected in series.

For example, the reset signal S7 may be a signal having an activation pulse at a start of a display period. For example, the reset signal S7 may be the vertical start signal. That is, when the reset signal S7 has an activation level at the start of the display period, the pull-up control node Q may be reset to the first low voltage VSS1 by the reset circuit 361.

The gate driving circuit ST(N) may further include a sensing selection circuit 371. The sensing selection circuit 371 may apply the previous carry signal CR(N−4) to a sensing control node S in response to a first sensing signal S1.

In an embodiment, the sensing selection circuit 371 may include a nineteenth-first transistor T19-1 and a nineteenth-second transistor T19-2. The nineteenth-first transistor T19-1 may include a gate electrode to which the first sensing signal S1 is applied, a first electrode to which the previous carry signal CR(N−4) is applied, and a second electrode connected to a third intermediate node B. The nineteenth-second transistor T19-2 may include a gate electrode to which the first sensing signal S1 is applied, a first electrode connected to the third intermediate node B, and a second electrode connected to the sensing control node S.

FIG. 5 illustrates that the sensing selection circuit 371 includes two transistors T19-1 and T19-2 connected in series to prevent or reduce leakage, but the present invention is not limited thereto, and the sensing selection circuit 371 may include one transistor or three or more transistors connected in series.

The gate driving circuit ST(N) may further include a first sensing control circuit 372 and a second sensing control circuit 373. The first sensing control circuit 372 may apply the high gate voltage VGH to the pull-up control node Q in response to a signal of the sensing control node S and a second sensing signal S2. The second sensing control circuit 373 may apply the first low voltage VSS1 to the pull-down control node QB in response to the signal of the sensing control node S and the second sensing signal S2.

In an embodiment, the first sensing control circuit 372 may include a twentieth transistor T20, a twenty-first transistor T21, and a third capacitor C3. The twentieth transistor T20 may include a gate electrode connected to the sensing control node S, a first electrode to which the high gate voltage VGH is applied, and a second electrode connected to the third intermediate node B. The twenty-first transistor T21 may include a gate electrode to which the second sensing signal S2 is applied, a first electrode connected to the third intermediate node B, and a second electrode connected to the pull-up control node Q. The third capacitor C3 may include a first electrode to which the high gate voltage VGH is applied and a second electrode connected to the sensing control node S. The high gate voltage VGH may be referred to as a sixth sensing signal S6.

In an embodiment, the second sensing control circuit 373 may include a twenty-second transistor T22 and a twenty-third transistor T23. The twenty-second transistor T22 may include a gate electrode connected to the sensing control node S, a first electrode connected to the pull-down control node QB, and a second electrode connected to a first electrode of the twenty-third transistor T23. The 23rd transistor T23 may include a gate electrode to which the second sensing signal S2 is applied, a first electrode connected to the second electrode of the twenty-second transistor T22, and a second electrode to which the first low voltage VSS1 is applied.

The first sensing signal S1 may have one activation pulse in the display period, and a gate line to be sensed may be selected by the first sensing signal S1.

The third capacitor C3 may store a high level voltage when a corresponding gate driving circuit is connected to the gate line to be sensed.

The second sensing signal S2 may have an activation pulse at a start of a blank period. When the second sensing signal S2 has an activation level, a gate signal may be applied to the gate line to be sensed by the first sensing signal S1.

In the present embodiment, clock signals CK(N−4) to CK(N+3) having eight different phases may be applied to the gate driving circuits. In FIG. 6, CK(N+4) is illustrated for convenience of description, and may mean the same signal as CK(N−4).

In FIG. 6, each of the scan clock signal SC_CK, the sensing clock signal SS_CK, and the carry clock signal CR_CK may be one of the clock signals CK(N−4) to CK(N+3).

Time period in which signals are applied may include a first period TP1, a second time period TP2, a third time period TP3, a fourth time period TP4, and a fifth time period TP5.

In the first period TP1, the previous carry signal CR(N−4) may have a high level (e.g., VGH). The signal of the pull-up control node Q may have a first high level (e.g., VGH). The signal of the pull-down control node QB may have a low level. A current clock signal CK(N) may be the carry clock signal CR_CK and may have a low level.

In the second period TP2, the previous carry signal CR(N−4) may have a low level. The signal of the pull-up control node Q may have the first high level (e.g., VGH). The signal of the pull-down control node QB may have a low level. The current clock signal CK(N) may be the carry clock signal CR_CK and may have a low level.

In the third period TP3, the previous carry signal CR(N−4) may have a low level. The signal of the pull-up control node Q may have a second high level (e.g., higher than 2VGH) higher than the first high level. For example, the voltage level of the signal of the pull-up control node Q may increase by capacitor coupling (or capacitor boosting) of the first capacitor C1. The signal of the pull-down control node QB may have a low level. The current clock signal CK(N) may be the carry clock signal CR_CK and may have a high level (e.g., VGH).

In the fourth period TP4, the previous carry signal CR(N−4) may have a low level. The signal of the pull-up control node Q may have the first high level (e.g., VGH). The signal of the pull-down control node QB may have a low level. The current clock signal CK(N) may be the carry clock signal CR_CK and may have a low level.

In the fifth period TP5, the previous carry signal CR(N−4) may have a low level. The signal of the pull-up control node Q may have a low level. The signal of the pull-down control node QB may have a high level. The current clock signal CK(N) can be the carry clock signal CR_CK and may have a low level.

The gate driving circuit ST(N) described with reference to FIGS. 4 to 6 is only an example, and the gate driving circuit ST(N) may vary with in the scope of including the first transistor T1 (the pull-up transistor) and the second capacitor C1 (the boost capacitor).

Figure 7:
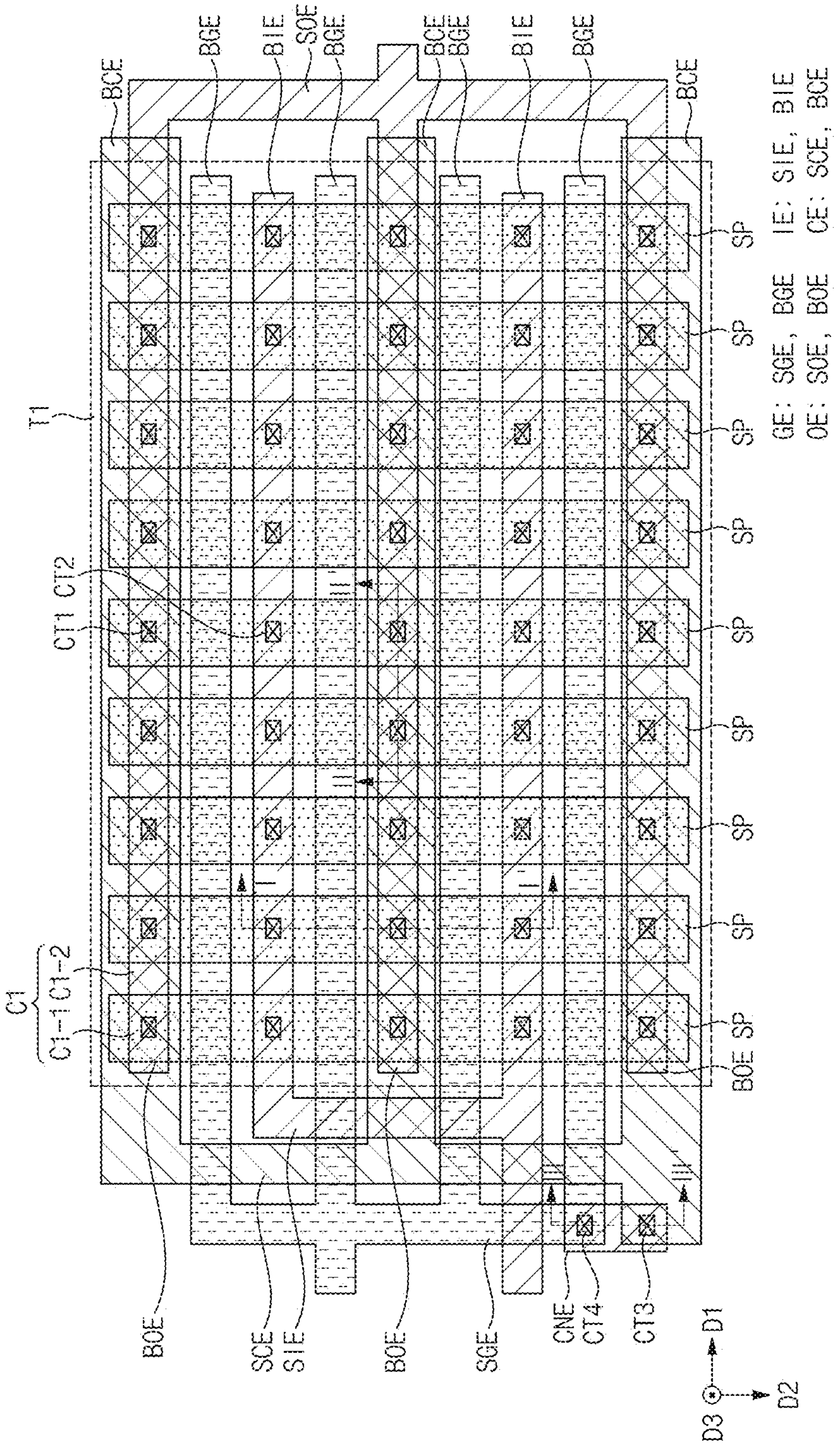
FIG. 7 is a plan view illustrating an example of a pull-up circuit of FIG. 5.
Figure 8:
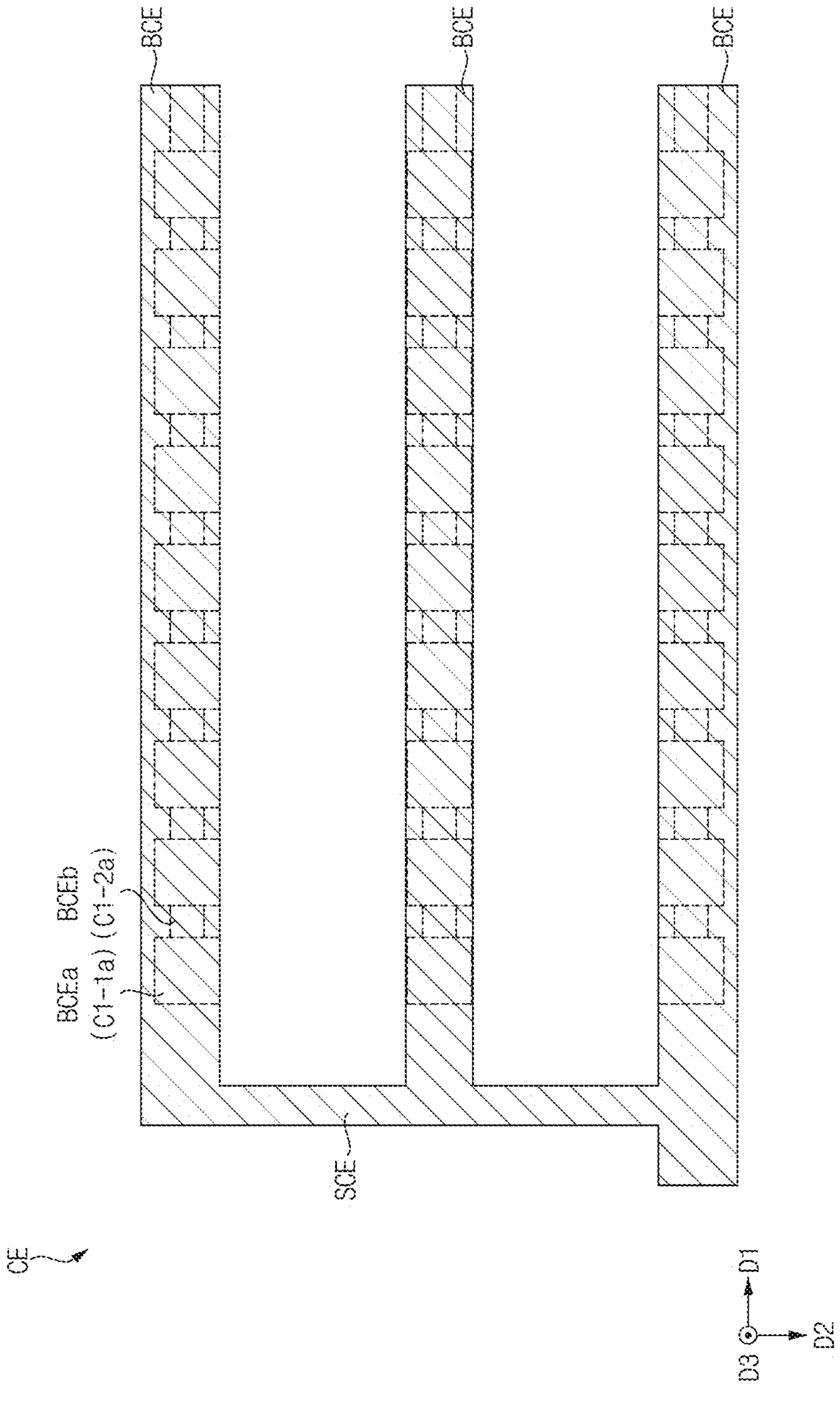
FIG. 8 is a plan view illustrating a capacitor electrode of FIG. 7.
Figure 9:
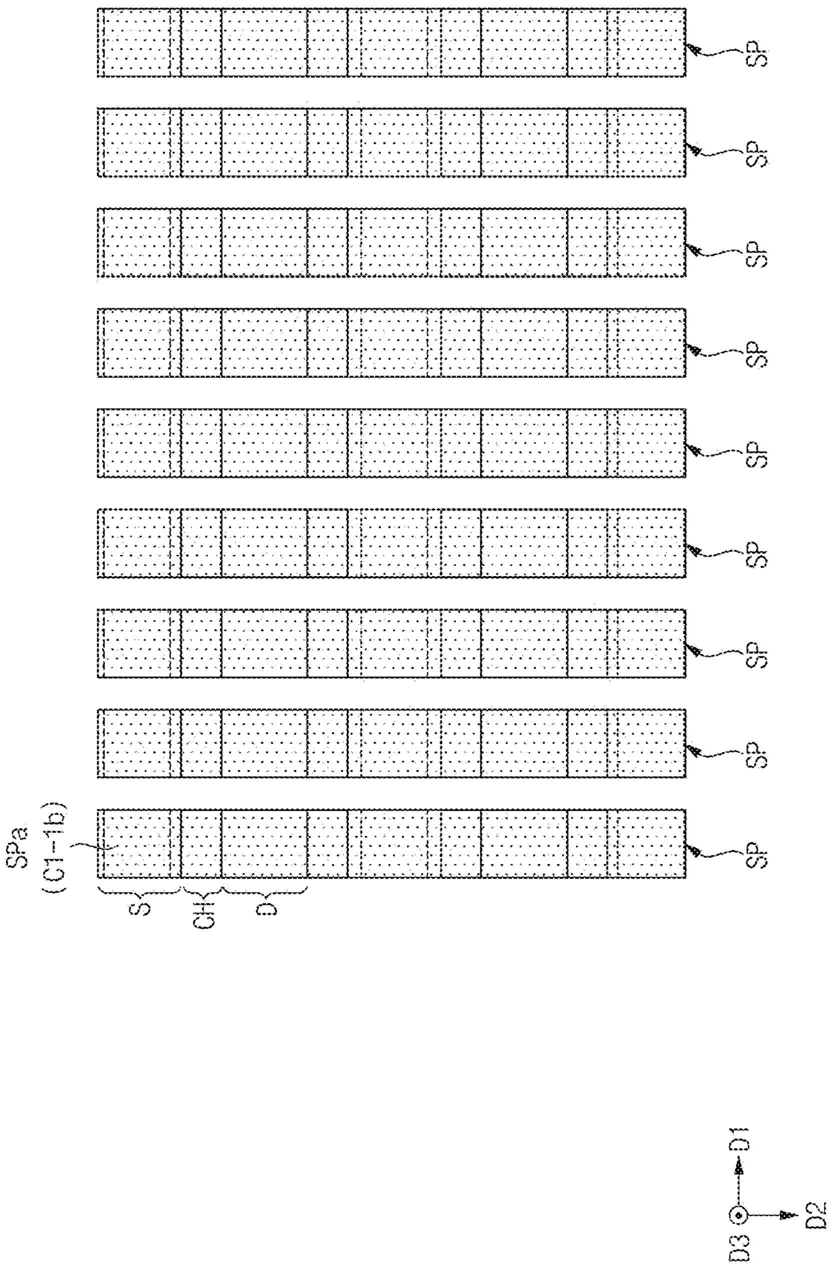
FIG. 9 is a plan view illustrating semiconductor patterns of FIG. 7.
Figure 10:
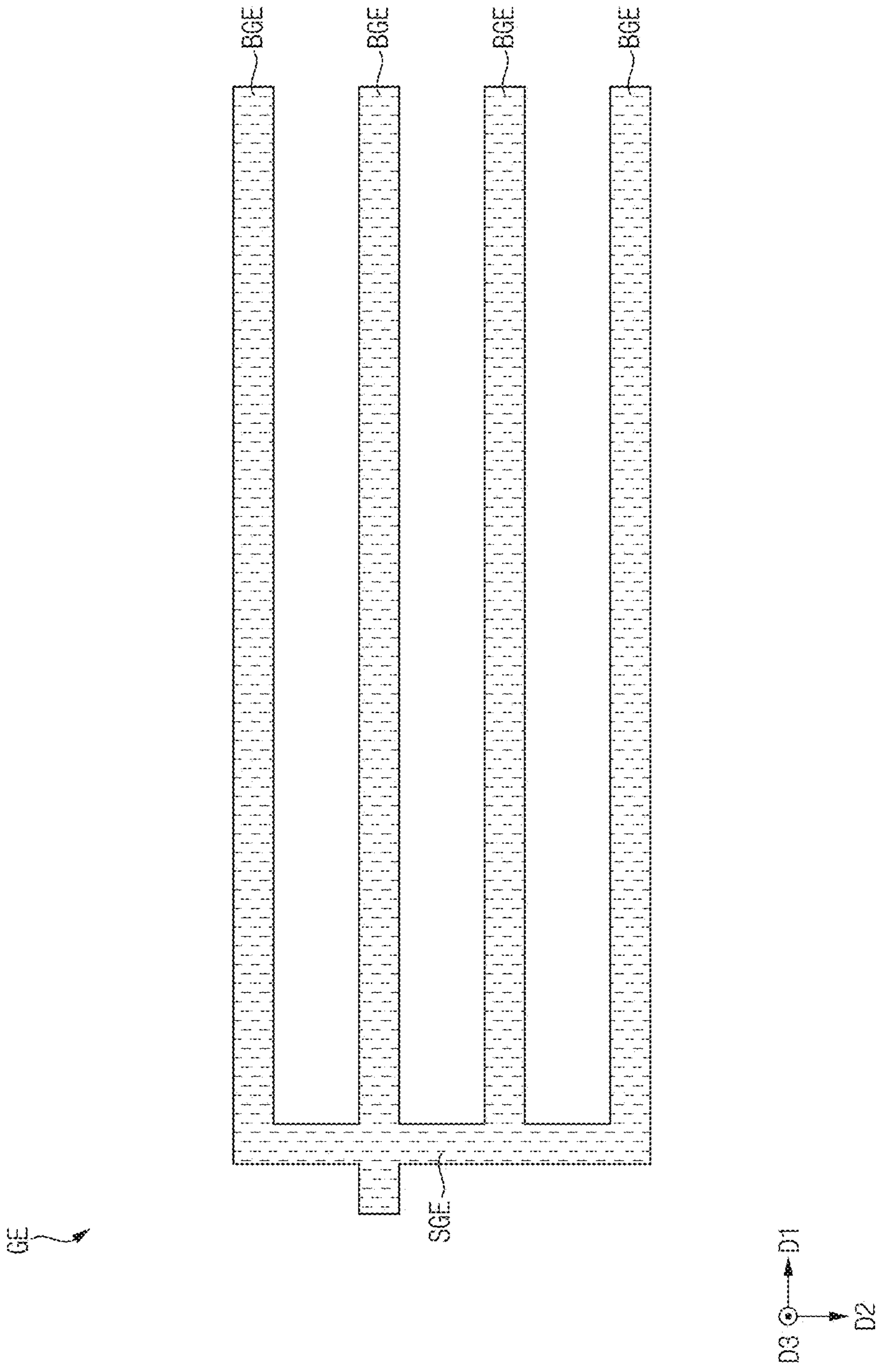
FIG. 10 is a plan view illustrating a gate electrode of FIG. 7.
Figure 11:
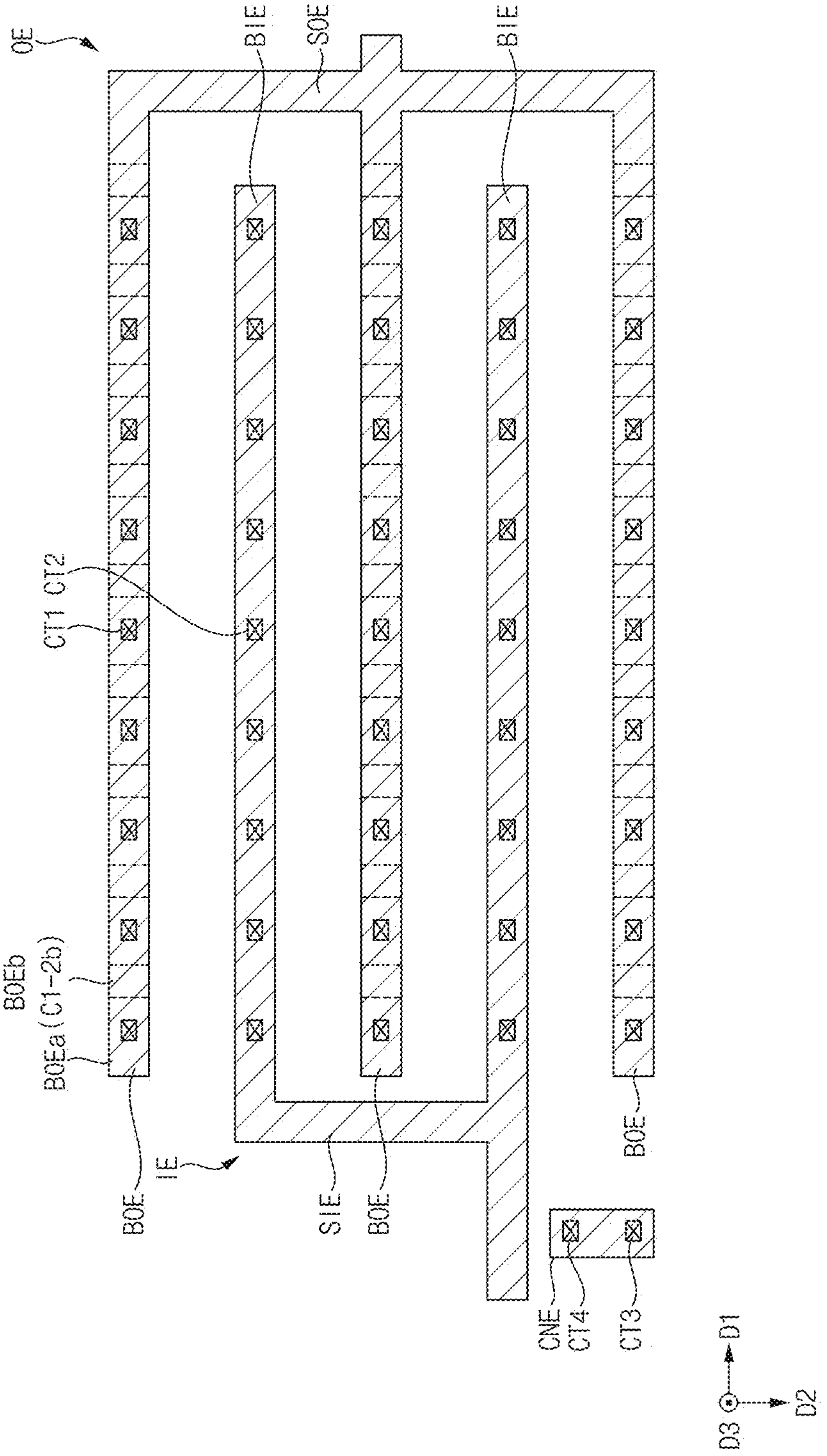
FIG. 11 is a plan view illustrating a source electrode, a drain electrode, and a connection electrode of FIG. 7.
Figure 12:
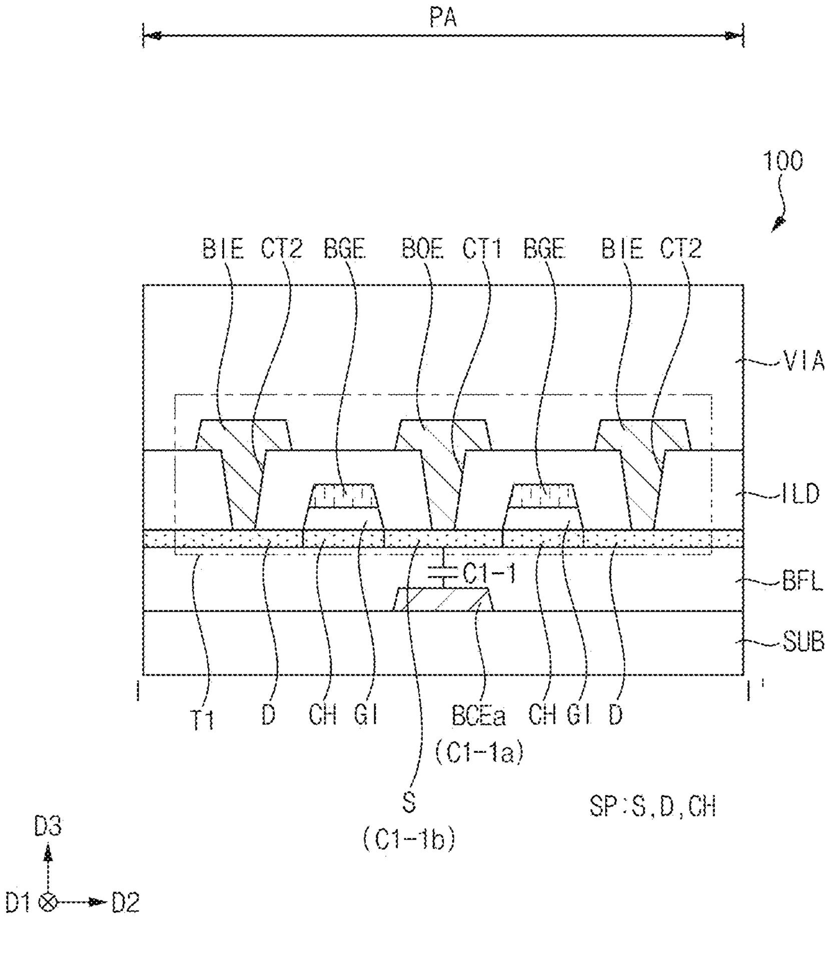
FIG. 12 is a cross-sectional view taken along line I-I' of FIG. 7.
Figure 13:
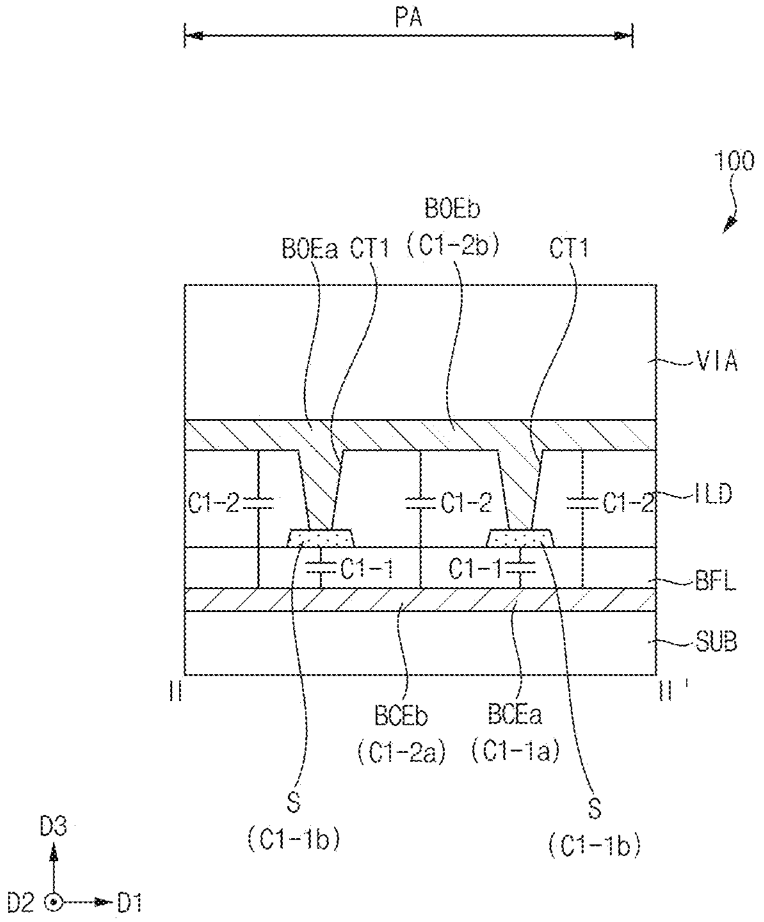
FIG. 13 is a cross-sectional view taken along line II-II' of FIG. 7.
Figure 14:
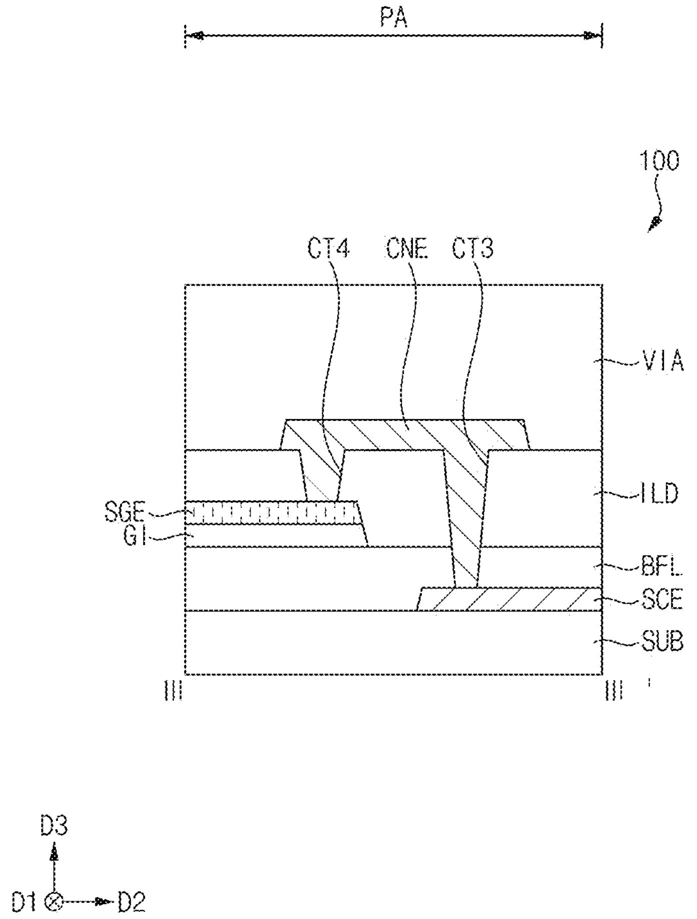
FIG. 14 is a cross-sectional view taken along line III-III' of FIG. 7.

FIG. 7 is a plan view illustrating an example of a pull-up circuit of FIG. 5. FIG. 8 is a plan view illustrating a capacitor electrode of FIG. 7. FIG. 9 is a plan view illustrating semiconductor patterns of FIG. 7. FIG. 10 is a plan view illustrating a gate electrode of FIG. 7. FIG. 11 is a plan view illustrating a source electrode, a drain electrode, and a connection electrode of FIG. 7. FIG. 12 is a cross-sectional view taken along line I-I' of FIG. 7. FIG. 13 is a cross-sectional view taken along line II-II' of FIG. 7. FIG. 14 is a cross-sectional view taken along line III-III' of FIG. 7. As used herein, the “plan view” is a view in a thickness direction (i.e., third direction DR3) of the gate driving circuit.

FIG. 7 may illustrate an example of a layout structure of the first transistor T1 and the first capacitor C1 included in the pull-up circuit 311 of FIG. 5. As described above with reference to FIG. 1, the gate driver 300 may be integrated in the peripheral area PA of the display panel 100. FIG. 7 may be an enlarged view of a portion of the peripheral area PA of the display panel 100 of FIG. 1 where the first transistor T1 and the first capacitor C1 are disposed.

In FIGS. 7 to 14, a third direction D3 crossing the first direction D1 and the second direction D2 may be defined. The third direction D3 may be a thickness direction. Hereinafter, the third direction D3 may be referred to as an upper direction, and a direction opposite to the third direction D3 may be referred to as a lower direction.

Referring to FIGS. 7 to 14, the first transistor T1 and the first capacitor C1 may be disposed in the peripheral area PA. In an embodiment, the first capacitor C1 may entirely overlap the first transistor T1 in a plan view. This will be described in detail later.

In an embodiment, the display device 10 (or each of the gate driving circuits included in the gate driver 300) may include a capacitor electrode CE, semiconductor patterns SP, a gate electrode GE, an input electrode IE, an output electrode OE, and a connection electrode CNE.

The capacitor electrode CE may be disposed in the peripheral area PA on the substrate SUB. The capacitor electrode CE may be disposed under the semiconductor patterns SP (in the direction opposite to the third direction D3 from the semiconductor patterns SP). The capacitor electrode CE may be disposed between the substrate SUB and the semiconductor patterns SP in the third direction D3.

In an embodiment, the capacitor electrode CE may be disposed between the substrate SUB and the buffer layer BFL. For example, the capacitor electrode CE and the bottom conductive layer BML of the first pixel transistor PT1 (see FIG. 3) may be in a same layer. For example, the capacitor electrode CE may include a same material as the bottom conductive layer BML, and may be substantially simultaneously formed with the bottom conductive layer BML. However, the present invention is not limited thereto, and the capacitor electrode CE may be formed in another conductive layer under the semiconductor patterns SP.

In an embodiment, the capacitor electrode CE may include a stem capacitor electrode SCE and branch capacitor electrodes BCE branched from the stem capacitor electrode SCE. The branch capacitor electrodes BCE may be integrally provided (or integrally formed) with the stem capacitor electrode SCE. Although FIGS. 7 and 8 illustrate that the capacitor electrode CE includes three branch capacitor electrodes BCE, the present invention is not limited thereto, and the capacitor electrode CE may include two or four or more branch capacitor electrodes BCE.

In an embodiment, the stem capacitor electrode SCE may extend generally in the second direction D2.

In an embodiment, the branch capacitor electrodes BCE may be branched from the stem capacitor electrode SCE in the first direction D1. Each of the branch capacitor electrodes BCE may extend from the stem capacitor electrode SCE in the first direction D1. The branch capacitor electrodes BCE may be spaced apart from each other in the second direction D2.

In an embodiment, the capacitor electrode CE may include a connection portion protruding from the stem capacitor electrode SCE in a direction opposite to the branch capacitor electrodes BCE (e.g., in a direction opposite to the first direction D1). For example, the connection portion of the capacitor electrode CE may be connected to the gate electrode GE through a connection electrode CNE. This will be described in detail later.

The semiconductor patterns SP may be disposed in the peripheral area PA on the substrate SUB. The semiconductor patterns SP may be disposed on the capacitor electrode CE (in the third direction D3 from the capacitor electrode CE). The semiconductor patterns SP may be disposed between the capacitor electrode CE and the gate electrode GE in the third direction D3.

In an embodiment, the semiconductor patterns SP may be disposed between the buffer layer BFL and the gate insulating layer GI. For example, the semiconductor patterns SP and the pixel semiconductor pattern PSP of the first pixel transistor PT1 (see FIG. 3) may be in a same layer. For example, the semiconductor patterns SP may include a same material as the pixel semiconductor pattern PSP, and may be substantially simultaneously formed with the pixel semiconductor pattern PSP. For example, the semiconductor patterns SP may include an oxide semiconductor material. However, the present invention is not limited thereto, and the semiconductor patterns SP may be formed in another semiconductor layer on the capacitor electrode CE.

In an embodiment, each of the semiconductor patterns SP may extend in the second direction D2. The semiconductor patterns SP may be spaced apart from each other in the first direction D1. Although FIGS. 7 and 9 illustrate that nine semiconductor patterns SP are disposed in the first direction D1, the present invention is not limited thereto, and two or more and eight or less, or ten or more semiconductor patterns SP may be disposed in the first direction D1.

In an embodiment, as illustrated in FIG. 9, each of the semiconductor patterns SP may include first contact areas D (e.g., drain areas), second contact areas S (e.g., source areas), and channel areas CH disposed in the second direction D2. The first contact areas D and the second contact areas S may have higher conductivity than the channel areas CH.

For example, in each of the semiconductor patterns SP, the first contact areas D and the second contact areas S may be alternately disposed in the second direction D2. Each of the channel areas CH may be positioned between one first contact area D and one second contact area S adjacent to each other in the second direction D2.

The gate electrode GE may be disposed in the peripheral area PA on the substrate SUB. The gate electrode GE may be disposed on the semiconductor patterns SP (in the third direction D3 from the semiconductor patterns SP). The gate electrode GE may be disposed between the semiconductor patterns SP and the input and output electrodes IE and OE in the third direction D3.

In an embodiment, the gate electrode GE may be disposed between the gate insulating layer GI and the interlayer-insulating layer ILD. For example, the gate electrode GE and the pixel gate electrode PGE of the first pixel transistor PT1 (see FIG. 3) may be in a same layer. For example, the gate electrode GE may include a same material as the pixel gate electrode PGE, and may be substantially simultaneously formed with the pixel gate electrode PGE. However, the present invention is not limited thereto, and the gate electrode GE may be formed in another conductive layer on the semiconductor patterns SP.

In an embodiment, the gate electrode GE may include a stem gate electrode SGE and branch gate electrodes BGE branched from the stem gate electrode SGE. The branch gate electrodes BGE may be integrally provided (or integrally formed) with the stem gate electrode SGE. Although FIGS. 7 and 10 illustrate that the gate electrode GE includes four branch gate electrodes BGE, the present invention is not limited thereto, and the gate electrode GE may include two, three, or five or more branch gate electrodes BGE.

In an embodiment, the stem gate electrode SGE may extend generally in the second direction D2.

In an embodiment, the branch gate electrodes BGE may be branched from the stem gate electrode SGE in the first direction D1. Each of the branch gate electrodes BGE may extend from the stem gate electrode SGE in the first direction D1. The branch gate electrodes BGE may be spaced apart from each other in the second direction D2.

In an embodiment, in a plan view, each of the branch gate electrodes BGE may overlap the channel areas CH of the semiconductor patterns SP disposed in the first direction D1.

In an embodiment, the gate electrode GE may include a connection portion protruding from the stem gate electrode SGE in a direction opposite to the branch gate electrodes BGE (e.g., in the direction opposite to the first direction D1). For example, the connection portion of the gate electrode GE may be connected to the pull-up control node Q of FIG. 5.

The input electrode IE and the output electrode OE may be disposed in the peripheral area PA on the substrate SUB. The input electrode IE and the output electrode OE may be disposed on the gate electrode GE (in the third direction D3 from the gate electrode GE).

The input electrode IE and the output electrode OE may be in a same layer. In an embodiment, the input electrode IE and the output electrode OE may be disposed between the interlayer-insulating layer ILD and the via-insulating layer VIA. For example, the input electrode IE, the output electrode OE, the pixel input electrode PIE, and the pixel output electrode POE of the first pixel transistor PT1 (see FIG. 3) may be in a same layer. For example, the input electrode IE and the output electrode OE may include a same material as the pixel input electrode PIE and the pixel output electrode POE, and may be substantially simultaneously formed with the pixel input electrode PIE and the pixel output electrode POE. However, the present invention is not limited thereto, and the input electrode IE and the output electrode OE may be formed in another conductive layer on the gate electrode GE.

In an embodiment, the input electrode IE may include a stem input electrode SIE and branch input electrodes BIE branched from the stem input electrode SIE. The branch input electrodes BIE may be integrally provided (or integrally formed) with the stem input electrode SIE. Although FIGS. 7 and 11 illustrate that the input electrode IE includes two branch input electrodes BIE, the present invention is not limited thereto, and the input electrode IE may include three or more branch input electrodes BIE.

In an embodiment, the stem input electrode SIE may extend generally in the second direction D2.

In an embodiment, the branch input electrodes BIE may be branched from the stem input electrode SIE in the first direction D1. Each of the branch input electrodes BIE may extend from the stem input electrode SIE in the first direction D1. The branch input electrodes BIE may be spaced apart from each other in the second direction D2.

In an embodiment, in a plan view, each of the branch input electrodes BIE may overlap the first contact areas D of semiconductor patterns SP disposed in the first direction D1. The branch input electrodes BIE may contact corresponding ones of the first contact areas D through first contact holes CT1, respectively. For example, the first contact holes CT1 may penetrate the interlayer-insulating layer ILD in the third direction D3.

In an embodiment, the input electrode IE may include a connection portion protruding from the stem input electrode SIE in a direction opposite to the branch input electrodes BIE (e.g., in the direction opposite to the first direction D1). For example, the gate clock signal SC_CK/SS_CK of FIG. 5 may be applied to the connection portion of the input electrode IE.

In an embodiment, the output electrode OE may include a stem output electrode SOE and branch output electrodes BOE branched from the stem output electrode SOE. The branch output electrodes BOE may be integrally provided (or integrally formed) with the stem output electrode SOE. Although FIGS. 7 and 11 illustrate that the output electrode OE includes three branch output electrodes BOE, the present invention is not limited thereto, and the output electrode OE may include two or four or more branch output electrodes BOE.

In an embodiment, the stem output electrode SOE may extend generally in the second direction D2. The stem output electrode SOE may be positioned in the first direction D1 from the stem input electrode SIE with the semiconductor patterns SP interposed therebetween.

In an embodiment, the branch output electrodes BOE may be branched from the stem output electrode SOE in the direction opposite to the first direction D1. Each of the branch output electrodes BOE may extend from the stem output electrode SOE in the direction opposite to the first direction D1. The branch output electrodes BOE may be spaced apart from each other in the second direction D2.

In an embodiment, unlike the drawing, the stem output electrode SOE may be positioned in the direction opposite to the first direction D1 from the stem input electrode SIE with the semiconductor patterns SP interposed therebetween. In this case, the branch input electrodes BIE may be branched from the stem input electrode SIE in the direction opposite to the first direction D1, and the branch output electrodes BOE may be branched from the stem output electrode SOE in the first direction D1.

In an embodiment, in a plan view, each of the branch output electrodes BOE may overlap the second contact areas S of semiconductor patterns SP disposed in the first direction D1. The branch output electrodes BOE may contact corresponding ones of the second contact areas S through second contact holes CT2, respectively. For example, the second contact holes CT2 may penetrate the interlayer-insulating layer ILD in the third direction D3.

In an embodiment, the output electrode OE may include a connection portion protruding from the stem output electrode SOE in a direction opposite to the branch output electrodes BOE (e.g., in the first direction D1). For example, the connection portion of the output electrode OE may be connected to the gate output terminal.

In an embodiment, between two branch input electrodes BIE adjacent to each other in the second direction D2, two branch gate electrodes BGE and one branch output electrode BOE may be disposed to be spaced apart from each other in the second direction D2. Between two branch input electrodes BIE adjacent to each other in the second direction D2, one branch output electrode BOE may be disposed between two branch gate electrodes BGE.

In an embodiment, between two branch output electrodes BOE adjacent to each other in the second direction D2, two branch gate electrodes BGE and one branch input electrode BIE may be disposed to be spaced apart from each other in the second direction D2. Between two branch output electrodes BOE adjacent to each other in the second direction D2, one branch input electrode BIE may be disposed between two branch gate electrodes BGE.

In an embodiment, in a plan view, the branch output electrodes BOE may overlap the branch capacitor electrodes BCE, respectively. For example, the branch output electrodes BOE may correspond one-to-one with the branch capacitor electrodes BCE.

The semiconductor patterns SP, the gate electrode GE, the input electrode IE, and the output electrode OE may constitute (or form) the first transistor T1. For example, the semiconductor patterns SP, the branch gate electrodes BGE, the branch input electrodes BIE, and the branch output electrodes BOE may constitute (or form) the first transistor T1.

The connection electrode CNE may be disposed in the peripheral area PA on the substrate SUB. The connection electrode CNE may connect the capacitor electrode CE and the gate electrode GE. The capacitor electrode CE may be electrically connected to the gate electrode GE through the connection electrode CNE. In an embodiment, the connection electrode CNE, the input electrode IE, and the output electrode OE may be in a same layer.

The connection electrode CNE may overlap each of the capacitor electrode CE and the gate electrode GE in a plan view. In a plan view, a first portion of the connection electrode CNE may overlap the capacitor electrode CE, and a second portion of the connection electrode CNE may overlap the gate electrode GE. The first portion of the connection electrode CNE may contact the capacitor electrode CE through a third contact hole CT3, and the second portion of the connection electrode CNE may contact the gate electrode GE through a fourth contact hole CT3. For example, the third contact hole CT3 may penetrate the buffer layer BFL and the interlayer-insulating layer ILD in the third direction D3, and the fourth contact hole CT4 may penetrate the interlayer-insulating layer ILD in the third direction D3.

FIG. 7 illustrates that the connection electrode CNE is disposed to connect the connection portion of the capacitor electrode CE and the stem gate electrode SGE of the gate electrode GE, but the present invention is not limited thereto, and a position of the connection electrode CNE may be variously changed.

Hereinafter, the first capacitor C1 may be described in more detail.

As described above with reference to FIG. 5, the first capacitor C1 may include the first electrode connected to the gate electrode GE of the first transistor T1, and the second electrode connected to the output electrode OE of the first transistor T1.

In an embodiment, the first capacitor C1 may include a first sub-capacitor C1-1 and a second sub-capacitor C1-2. The first capacitor C1 may include a plurality of first sub-capacitors C1-1 and a plurality of second sub-capacitors C1-2. For example, the first sub-capacitors C1-1 and the second sub-capacitors C1-2 may be connected in parallel to increase a capacitance of the first capacitor C1.

In an embodiment, as illustrated in FIG. 8, each of the branch capacitor electrodes BCE may include first portions BCEa and second portions BCEb adjacent to each other. The first portions BCEa may be portions that overlap the semiconductor patterns SP (e.g., the second contact areas S of the semiconductor patterns SP) in a plan view. The second portions BCEb may be portions that do not overlap the semiconductor patterns SP in a plan view, but overlap the branch output electrode BOE. The first portions BCEa and the second portions BCEb may be integrally provided (or integrally formed) with each other.

In an embodiment, since the semiconductor patterns SP are spaced apart from each other in the first direction D1, in each of the branch capacitor electrodes BCE, the first portions BCEa and the second portions BCEb may be alternately disposed in the first direction D1.

In an embodiment, in a plan view, a size of each of the second portions BCEb may be less than a size of each of the first portions BCEa. For example, a width of each of the second portions BCEb in the first direction D1 may be less than a width of each of the first portions BCEa in the first direction D1. For example, a width of each of the second portions BCEb in the second direction D2 may be less than a width of each of the first portions BCEa in the second direction D2. However, the present invention is not limited thereto.

In an embodiment, as illustrated in FIG. 9, each of the semiconductor patterns SP may include portions SPa disposed in the second direction D2. The portions SPa may be portions that overlap the branch capacitor electrodes BCE (e.g., the first portions BCEa of the branch capacitor electrodes BCE) in a plan view. Each of the portions SPa may be a portion of each second contact area S.

The branch capacitor electrode BCE and the second contact area S of the semiconductor pattern SP, which overlap each other in a plan view (or in the third direction DR3), may constitute (or form) the first sub-capacitor C1-1. For example, the first portion BCEa of the branch capacitor electrode BCE and the portion SPa of the semiconductor pattern SP, which overlap each other in a plan view (or in the third direction DR3), may constitute (or form) one first sub-capacitor C1-1. The first portion BCEa of the branch capacitor electrode BCE may function as one electrode C1-1*a* (hereinafter, referred to as a first-first electrode of the first sub-capacitor C1-1), and the portion SPa of the semiconductor pattern SP may function as the other electrode C1-1*b* (hereinafter, referred to as a first-second electrode of the first sub-capacitor C1-1). An insulating layer (e.g., the buffer layer BFL) may be disposed between the first-first electrode C1-1*a* and the first-second electrode C1-1*b*.

In an embodiment, as illustrated in FIG. 11, each of the branch output electrodes BOE may include first portions BOEa and second portions BOEb adjacent to each other. The first portions BOEa may be portions that overlap the semiconductor patterns SP (e.g., the second contact areas S of the semiconductor patterns SP) in a plan view. The second portions BOEb may be portions that do not overlap the semiconductor patterns SP in a plan view, but overlap the branch capacitor electrode BCE. The first portions BOEa and the second portions BOEb may be integrally provided (or integrally formed) with each other.

In an embodiment, since the semiconductor patterns SP are spaced apart from each other in the first direction D1, in each of the branch output electrodes BOE, the first portions BOEa and the second portions BOEb may be alternately disposed in the first direction D1.

In an embodiment, in a plan view, a size of each of the second portions BOEb may be less than a size of each of the first portions BOEa. For example, a width of each of the second portions BOEb in the first direction D1 may be less than a width of each of the first portions BOEa in the first direction D1. For example, a width of each of the second portions BOEb in the second direction D2 may be equal to a width of each of the first portions BOEa in the second direction D2. However, the present invention is not limited thereto.

The branch capacitor electrode BCE and the branch output electrode BOE, which overlap each other in a plan view (or in the third direction DR3), may constitute (or form) the second sub-capacitor C1-2. For example, the second portion BCEb of the branch capacitor electrode BCE and the second portion BOEb of the branch output electrode BOE, which overlap each other in a plan view (or in the third direction DR3), may constitute (or form) one second sub-capacitor C1-2. The second portion BCEb of the branch capacitor electrode BCE may function as one electrode C1-2*a* (hereinafter, referred to as a second-first electrode of the second sub-capacitor C1-2), and the second portion BOEb of the branch output electrode BOE may function as the other electrode C1-2*b* (hereinafter, referred to as a second-second electrode of the second sub-capacitor C1-2). An insulating layer (e.g., the buffer layer BFL and the interlayer-insulating layer ILD) may be disposed between the second-first electrode C1-2*a* and the second-second electrode C1-2*b*.

In an embodiment, as illustrated in FIGS. 7 to 11, in an area overlapping one of the branch capacitor electrodes BCE, a plurality of first sub-capacitors C1-1 may be spaced apart from each other in the first direction D1, and a plurality of second sub-capacitors C1-2 may be spaced apart from each other in the first direction D1. For example, the first sub-capacitors C1-1 and the second sub-capacitors C1-2, which overlap one of the branch output electrodes BOE in a plan view, may be alternately disposed in the first direction D1.

In an embodiment, since the second portion BOEb of the branch output electrode BOE functions as the second-second electrode C1-2*b* of the second sub-capacitor C1-2, each of the second sub-capacitors C1-2 may entirely overlap a corresponding one of the branch output electrodes BOE in a plan view. In addition, since the portion SPa of the semiconductor pattern SP functions as the first-second electrode C1-1*b* of the first sub-capacitor C1-1, each of the first sub-capacitors C1-1 may entirely overlap a corresponding one of the semiconductor patterns SP in a plan view. Therefore, in a plan view, a size of the first capacitor C1 including the first sub-capacitors C1-1 and the second sub-capacitors C1-2 may be less than a size of the first transistor T1.

In an embodiment, in a plan view, a size of each of the second sub-capacitors C1-2 may be less than a size of each of the first sub-capacitors C1-1. However, the present invention is not limited thereto.

The capacitor electrode CE may include the first-first electrode C1-1*a* of the first sub-capacitor C1-1 and the second-first electrode C1-2*a* of the second sub-capacitor C1-2. The first-first electrode C1-1*a* of the first sub-capacitor C1-1 and the second-first electrode C1-2*a* of the second sub-capacitor C1-2 may be integrally provided (or integrally formed) with each other. The second contact area S of the semiconductor pattern SP may include the first-second electrode C1-1*b* of the first sub-capacitor C1-1. The branch output electrode BOE may include the second-second electrode C1-2*b* of the second sub-capacitor C1-2.

The first electrode of the first capacitor C1 connected to the gate electrode GE of the first transistor T1 may include the first-first electrode C1-1*a* of the first sub-capacitor C1-1 and the second-first electrode C1-2*a* of the second sub-capacitor C1-2. The second electrode of the first capacitor C1 connected to the output electrode OE of the first transistor T1 may include the first-second electrode C1-1*b* of the first sub-capacitor C1-1 and the second-second electrode C1-2*b* of the second sub-capacitor C1-2.

According to embodiments of the present invention, the first capacitor C1 (the boost capacitor) may be disposed to entirely overlap the first transistor T1 (the buffer transistor) in a plan view. The first capacitor C1 may include the first sub-capacitors C1-1 and the second sub-capacitors C1-2 connected in parallel. Accordingly, the capacitance of the first capacitor C1 may be sufficiently secured, and also a size of an area, where the gate driving circuit ST[N] (see FIG. 5) including the first capacitor C1 and the first transistor T1 is disposed in the peripheral area PA, may be minimized. That is, a degree of integration of the gate driving circuit ST[N] may be improved. Therefore, a dead space of the display device 10 may be effectively reduced.

Figure 15:
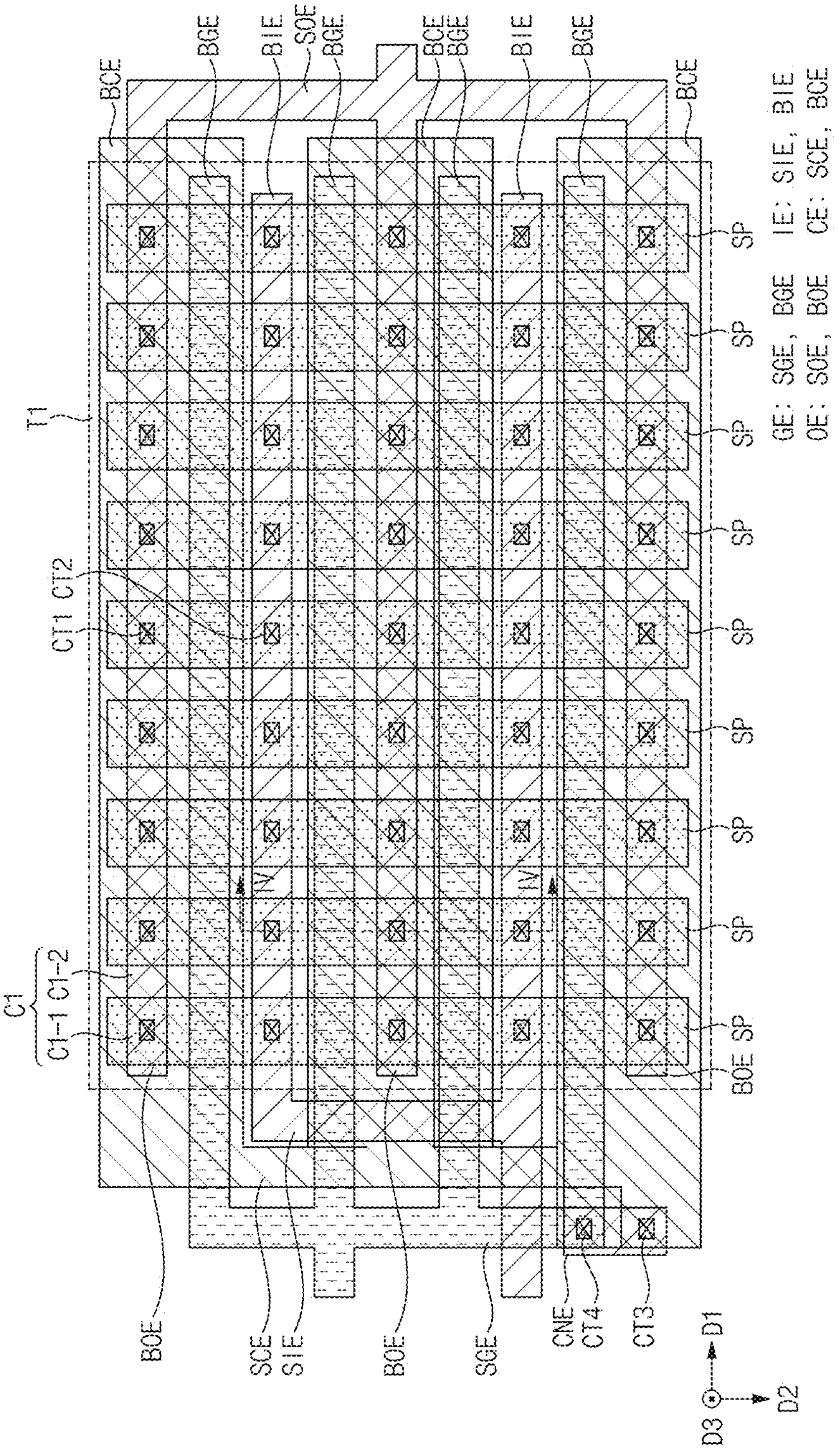
FIG. 15 is a plan view illustrating another example of the pull-up circuit of FIG. 5.
Figure 17:
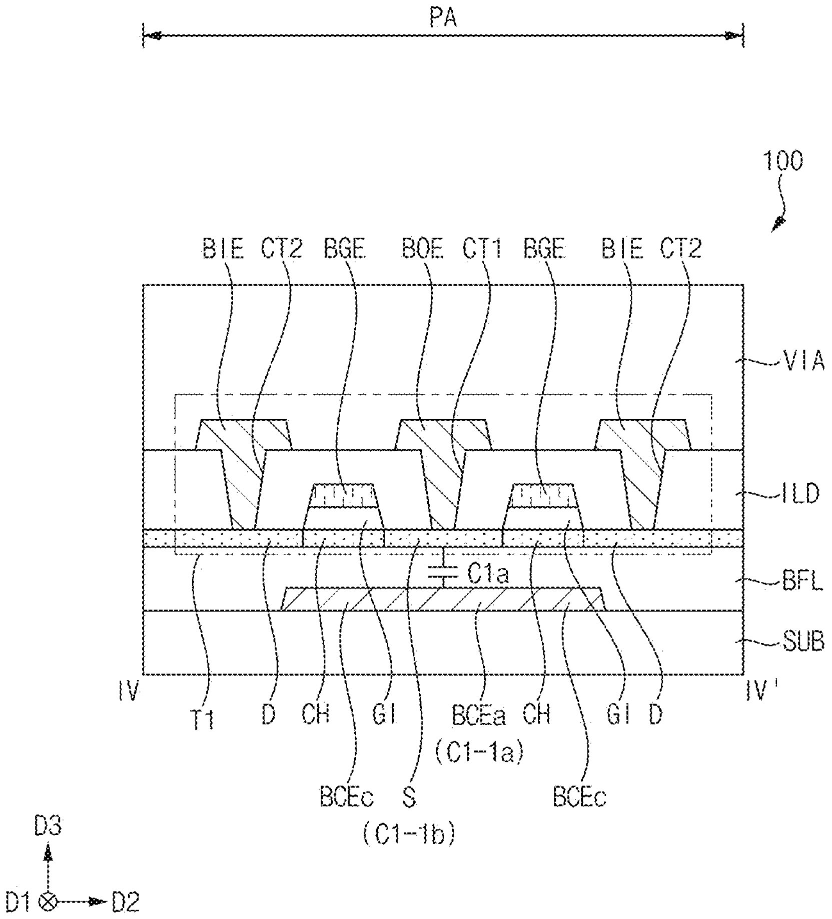
FIG. 17 is a cross-sectional view taken along line IV-IV' of FIG. 15.

FIG. 15 is a plan view illustrating another example of the pull-up circuit of FIG. 5. FIG. 16 is a plan view illustrating a capacitor electrode of FIG. 15. FIG. 17 is a cross-sectional view taken along line IV-IV' of FIG. 15.

FIG. 15 may illustrate another example of the layout structure of the first transistor T1 and the first capacitor C1 included in the pull-up circuit 311 of FIG. 5. FIG. 15 may correspond to FIG. 7, FIG. 16 may correspond to FIG. 8, and FIG. 17 may correspond to FIG. 12.

Embodiments of FIGS. 15 to 17 may be substantially the same as or similar to the embodiments described with reference to FIGS. 7 to 14, except that the first transistor T1 has a dual gate structure. Therefore, repeated description will be omitted or simplified.

Referring to FIGS. 15 to 17, the capacitor electrode CE may be disposed under the semiconductor patterns SP, and the gate electrode GE may be disposed on the semiconductor patterns SP. The capacitor electrode CE may be electrically connected to the gate electrode GE through the connection electrode CNE.

In an embodiment, the capacitor electrode CE may include the stem capacitor electrode SCE and the branch capacitor electrodes BCE branched from the stem capacitor electrode SCE. The stem capacitor electrode SCE may extend generally in the second direction D2. The branch capacitor electrodes BCE may be branched from the stem capacitor electrode SCE in the first direction D1. Each of the branch capacitor electrodes BCE may extend from the stem capacitor electrode SCE in the first direction D1. The branch capacitor electrodes BCE may be spaced apart from each other in the second direction D2.

Compared to the embodiments of FIGS. 7 to 14, each of the branch capacitor electrodes BCE may be formed to have a relatively wide width in the second direction D2 so as to further overlap the channel areas CH of the semiconductor patterns SP.

In an embodiment, each of the branch capacitor electrodes BCE may include the first portions BCEa, the second portions BCEb, and third portions BCEc that are adjacent to each other. The first portions BCEa may be portions that overlap the second contact areas S of the semiconductor patterns SP in a plan view. The second portions BCEb may be portions that do not overlap the semiconductor patterns SP in a plan view, but overlap the branch output electrodes BOE. The third portions BCEc may be portions that overlap the channel areas CH of the semiconductor patterns SP in a plan view. For example, each of the third portions BCEc may be adjacent to a corresponding one of the first portions BCEa in the second direction D2. The first to third portions BCEa, BCEb, and BCEc may be integrally provided (or integrally formed) with each other.

The first transistor T1 may have the dual gate structure including a bottom gate electrode disposed under the channel area of the semiconductor pattern and a top gate electrode disposed on the channel area. The third portions BCEc of the branch capacitor electrodes BCE may function as the bottom gate electrode of the first transistor T1, and the gate electrode GE may function as the top gate electrode of the first transistor T1.

The display device 10 according to embodiments described above may be applied to various electronic devices.

Figure 18:
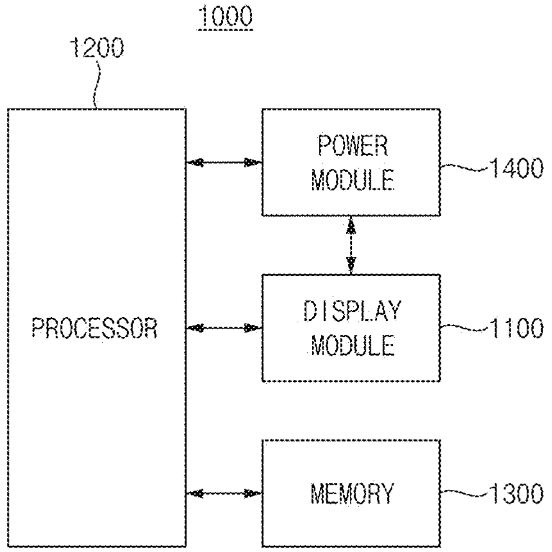
FIG. 18 is a block diagram illustrating an electronic device according to an embodiment.

FIG. 18 is a block diagram illustrating an electronic device according to an embodiment.

Referring to FIG. 18, an electronic device 1000 may include a display module 1100, a processor 1200, a memory 1300, and a power module 1400.

In an embodiment, the electronic device 1000 may include the display device 10 of FIG. 1. The electronic device 1000 may further include modules or devices with additional functions other than the display device.

The processor 1200 may include at least one of a central processing unit ("CPU"), an application processor ("AP"), a graphic processing unit ("GPU"), a communication processor ("CP"), an image signal processor ("ISP"), and a controller.

In an embodiment, the processor 1200 may be configured to provide input image data (the input image data IMG of FIG. 1) and an input control signal (the input control signal CONT of FIG. 1) to the display device.

The memory 1300 may store data information for the operation of the processor 1200 or the display module 1100. When the processor 1200 executes the application stored in the memory 1500, the input image data and/or the input control signal may be transmitted to the display module 1100, and the display module 1100 may process the received signal and output image information through a display screen.

The power module 1400 may include a power supply module, such as a power adapter or a battery device, and a power conversion module which converts the power supplied by the power supply module to generate power for the operation of the electronic device 1000.

At least one of each component of the electronic device 1000 described above may be included in the display device according to embodiments. In addition, some of the individual modules functionally included in one module may be included in the display device, and other portions may be provided separately from the display device. For example, the display device may include the display module 1100, and the processor 1200, the memory 1300, and the power module 1400 may be provided in the form of other devices within the electronic device 1000 other than the display device.

Figure 19:
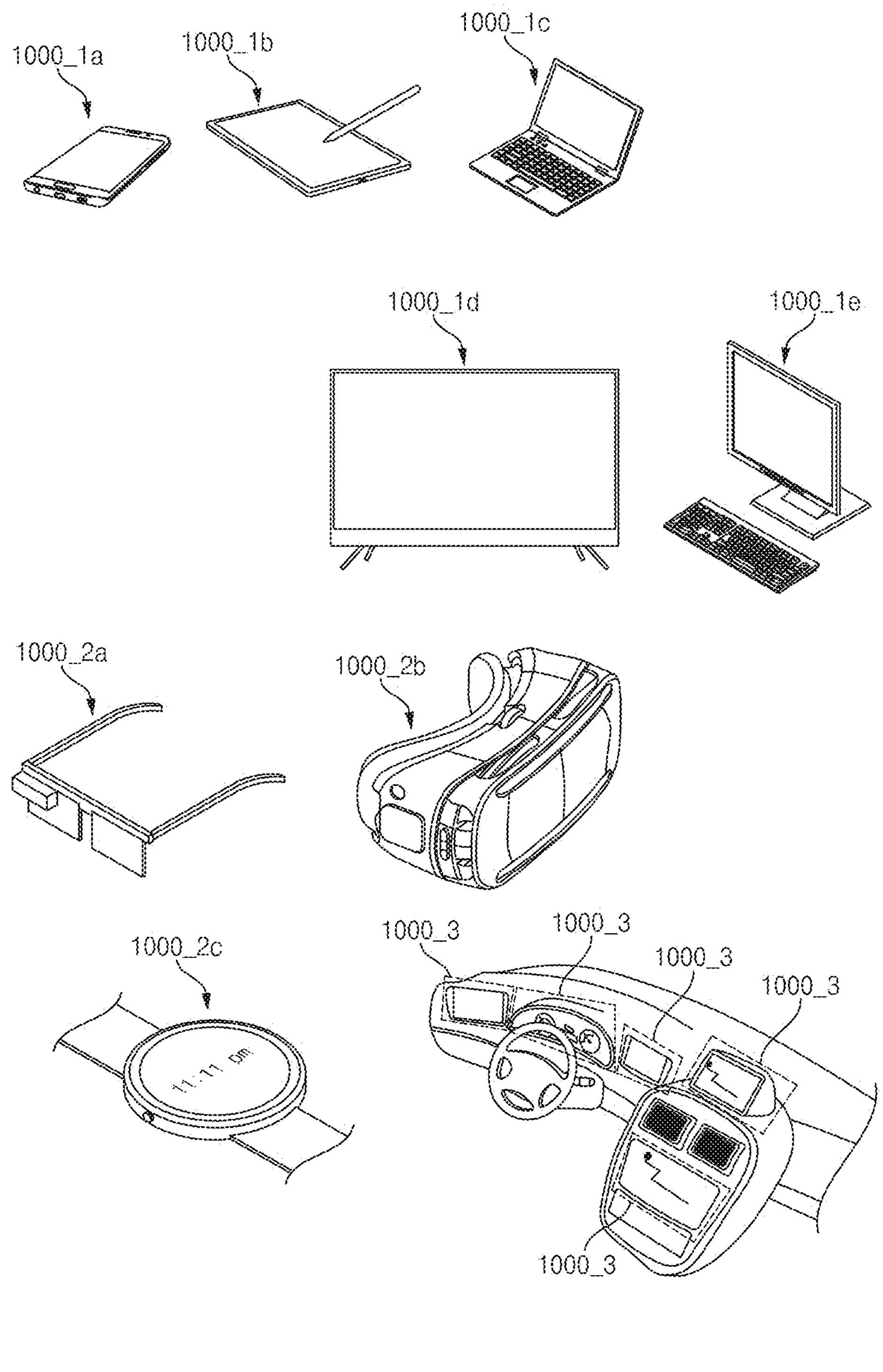
FIG. 19 is a schematic diagram illustrating an electronic device according to various embodiments.

FIG. 19 is a schematic diagram illustrating electronic devices according to various embodiments.

Referring to FIG. 19, various electronic devices 1000 to which the display device according to embodiments are applied may include not only image display electronic devices such as a smartphone 1000_1*a*, a tablet PC 1000_1*b*, a laptop 1000_1*c*, a TV 1000_1*d*, and a desktop monitor 1000_1*e*, but also wearable electronic devices including display modules, such as smart glasses 1000_2*a*, a head-mounted display 1000_2*b*, and a smart watch 1000_2*c*, automotive electronic devices 1000_3 including display modules, such as a dashboard of a car, a center fascia, a Center Information Display ("CID") disposed on a dashboard, and a room mirror display, or the like.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A gate driving circuit comprising:

a buffer transistor, which outputs a gate clock signal as a gate output signal in response to a signal of a pull-up control node, wherein the buffer transistor includes a semiconductor pattern, a gate electrode connected to the pull-up control node, an input electrode to which the gate clock signal is applied, and an output electrode connected to a gate output terminal; and a boost capacitor, which boosts a voltage level of the signal of the pull-up control node, wherein the boost capacitor includes a first electrode connected to the gate electrode of the buffer transistor and a second electrode connected to the output electrode of the buffer transistor, wherein the boost capacitor entirely overlaps the buffer transistor in a plan view.

2. The gate driving circuit of claim 1, further comprising:

a capacitor electrode disposed under the semiconductor pattern and electrically connected to the gate electrode, wherein the semiconductor pattern includes a first contact area, a second contact area spaced apart from the first contact area, and a channel area between the first contact area and the second contact area, wherein the gate electrode is disposed on the semiconductor pattern and overlaps the channel area of the semiconductor pattern in the plan view, wherein the input electrode is disposed on the gate electrode and contacts the first contact area of the semiconductor pattern, wherein the output electrode is disposed on the gate electrode and contacts the second contact area of the semiconductor pattern, wherein the capacitor electrode includes a first portion overlapping the second contact area of the semiconductor pattern in the plan view, and wherein the first portion of the capacitor electrode and the second contact area of the semiconductor pattern constitute the boost capacitor.

3. The gate driving circuit of claim 2, wherein the boost capacitor includes a first sub-capacitor and a second sub-capacitor, and wherein the first portion of the capacitor electrode and the second contact area of the semiconductor pattern constitute the first sub-capacitor.

4. The gate driving circuit of claim 3, wherein the first sub-capacitor entirely overlaps the semiconductor pattern in the plan view.

5. The gate driving circuit of claim 3, wherein the capacitor electrode further includes a second portion adjacent to the first portion and overlapping the output electrode in the plan view, and wherein the second portion of the capacitor electrode and the output electrode constitute the second sub-capacitor.

6. The gate driving circuit of claim 5, wherein the second sub-capacitor entirely overlaps the output electrode.

7. The gate driving circuit of claim 5, wherein the first electrode of the boost capacitor includes a first-first electrode and a second-first electrode, wherein the second electrode of the boost capacitor includes a first-second electrode and a second-second electrode, wherein the capacitor electrode includes the first-first electrode and the second-first electrode, wherein the second contact area of the semiconductor pattern includes the first-second electrode, and wherein the output electrode includes the second-second electrode.

8. The gate driving circuit of claim 5, wherein the semiconductor pattern of the buffer transistor is provided in plurality, and the plurality of semiconductor patterns are arranged in a first direction and each of the semiconductor patterns extends in a second direction crossing the first direction, wherein the output electrode includes a plurality of branch output electrodes each extending in the first direction, wherein the first sub-capacitor is provided in plurality and the second sub-capacitor is provided in plurality, and wherein the plurality of the first sub-capacitors and the plurality of the second sub-capacitors overlap the plurality of branch output electrodes in the plan view.

9. The gate driving circuit of claim 8, wherein some of the first sub-capacitors and some of the second sub-capacitors, which overlap one of the plurality of branch output electrodes in the plan view, are alternately disposed in the first direction.

10. The gate driving circuit of claim 5, wherein the capacitor electrode further includes a third portion adjacent to the first portion and overlapping the channel area of the semiconductor pattern in the plan view, wherein the buffer transistor has a dual gate structure, and wherein the gate electrode is a top gate electrode of the buffer transistor, and the third portion of the capacitor electrode is a bottom gate electrode of the buffer transistor.

11. The gate driving circuit of claim 3, wherein in the plan view, a size of the second sub-capacitor is less than a size of the first sub-capacitor.

12. The gate driving circuit of claim 2, further comprising:

a connection electrode connecting the capacitor electrode and the gate electrode.

13. The gate driving circuit of claim 1, wherein in the plan view, a size of the boost capacitor is less than a size of the buffer transistor.

14. The gate driving circuit of claim 1, wherein the semiconductor pattern includes an oxide semiconductor material.

15. A display device comprising:

a substrate including a display area and a peripheral area around the display area;

a pixel transistor disposed in the display area on the substrate;

a light emitting element disposed in the display area on the substrate and connected to the pixel transistor; and a gate driving circuit disposed in the peripheral area on the substrate and including:

a buffer transistor, which outputs a gate clock signal as a gate output signal in response to a signal of a pull-up control node, the buffer transistor including a semiconductor pattern, a gate electrode connected to the pull-up control node, an input electrode to which the gate clock signal is applied, and an output electrode connected to a gate output terminal; and a boost capacitor, which boosts a voltage level of the signal of the pull-up control node, the boost capacitor including a first electrode connected to the gate electrode of the buffer transistor and a second electrode connected to the output electrode of the buffer transistor, wherein the boost capacitor entirely overlaps the buffer transistor in a plan view.

16. The display device of claim 15, wherein the semiconductor pattern includes a first contact area, a second contact area spaced apart from the first contact area, and a channel area between the first contact area and the second contact area, wherein the gate electrode is disposed on the semiconductor pattern and overlaps the channel area of the semiconductor pattern in the plan view, wherein the input electrode is disposed on the gate electrode and contacts the first contact area of the semiconductor pattern, wherein the output electrode is disposed on the gate electrode and contacts the second contact area of the semiconductor pattern, wherein the gate driving circuit includes a capacitor electrode disposed under the semiconductor pattern, electrically connected to the gate electrode, and including a first portion overlapping the second contact area of the semiconductor pattern in the plan view, and wherein the first portion of the capacitor electrode and the second contact area of the semiconductor pattern constitute the boost capacitor.

17. The display device of claim 16, wherein the pixel transistor includes a pixel semiconductor pattern, a pixel gate electrode, a pixel input electrode, a pixel output electrode, and a bottom conductive layer disposed under the pixel semiconductor pattern and connected to the pixel output electrode, and wherein the capacitor electrode and the bottom conductive layer are in a same layer.

18. The display device of claim 16, wherein the boost capacitor includes a first sub-capacitor and a second sub-capacitor, and wherein the first portion of the capacitor electrode and the second contact area of the semiconductor pattern constitute the first sub-capacitor.

19. The display device of claim 18, wherein the capacitor electrode further includes a second portion adjacent to the first portion and overlapping the output electrode in the plan view, and wherein the second portion of the capacitor electrode and the output electrode constitute the second sub-capacitor.

20. An electronic device comprising:

a display device including:

a display panel including a plurality of gate lines; and a gate driver including a plurality of gate driving circuits, which outputs gate signals to the plurality of gate lines; and a processor, which provides input image data and an input control signal to the display device, wherein each of the plurality of gate driving circuits includes:

a buffer transistor, which outputs a gate clock signal as a gate output signal in response to a signal of a pull-up control node, the buffer transistor including a semiconductor pattern, a gate electrode connected to the pull-up control node, an input electrode to which the gate clock signal is applied, and an output electrode connected to a gate output terminal; and a boost capacitor, which boosts a voltage level of the signal of the pull-up control node, the boost capacitor including a first electrode connected to the gate electrode of the buffer transistor and a second electrode connected to the output electrode of the buffer transistor, wherein the boost capacitor entirely overlaps the buffer transistor in a plan view.

* * * * *